US012787831B2

(12) United States Patent
Baek et al.

(10) Patent No.: US 12,787,831 B2
(45) Date of Patent: Nov. 3, 2026

(54) SEMICONDUCTOR PACKAGE HAVING A DOUBLE VIA

(71) Applicant: SAMSUNG ELECTRONICS CO., LTD., Suwon-si (KR)

(72) Inventors: Joonghyun Baek, Suwon-si (KR); Hyunsoo Chung, Suwon-si (KR); Dongok Kwak, Suwon-si (KR); Eunjeong Im, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 352 days.

(21) Appl. No.: 18/386,003

(22) Filed: Nov. 1, 2023

(65) Prior Publication Data

US 2024/0153856 A1 May 9, 2024

(30) Foreign Application Priority Data

Nov. 3, 2022 (KR) ........................ 10-2022-0145559

(51) Int. Cl.
*H10W 70/65* (2026.01)
*H10B 80/00* (2023.01)
(Continued)

(52) U.S. Cl.
CPC .......... *H10W 70/685* (2026.01); *H10B 80/00* (2023.02); *H10W 70/65* (2026.01);
(Continued)

(58) Field of Classification Search
CPC ................................................ H01L 23/49822
(Continued)

(56) References Cited

U.S. PATENT DOCUMENTS 8,664,540 B2 3/2014 Lu et al.
8,791,554 B2 7/2014 Kwak et al.
(Continued)

FOREIGN PATENT DOCUMENTS

KR 20110045222 A * 5/2011 .......... H10W 74/117
KR 10-2022-0109753 A 8/2022
KR 10-2022-0126320 A 9/2022

OTHER PUBLICATIONS

Office Action in Korean Appln. No. 10-2022-0145559, mailed on Jul. 30, 2026, 16 pages (with English translation).

*Primary Examiner* — Phuc T Dang
(74) *Attorney, Agent, or Firm* — Fish & Richardson P.C.

(57) ABSTRACT

A semiconductor package having a lower redistribution structure includes a redistribution insulation layer, a plurality of ball pads in the redistribution insulation layer apart from one another, a double via which includes a first active via and a dummy via located on at least one of the plurality of ball pads and apart from each other in the redistribution insulation layer, and a first active redistribution layer electrically connected to the first active via in the redistribution insulation layer, solder balls electrically connected to the plurality of ball pads under the lower redistribution structure, a first semiconductor chip on the lower redistribution structure and electrically connected to the first active via and the first active redistribution layer of the lower redistribution structure, and a molding layer molding the first semiconductor chip on the lower redistribution structure.

18 Claims, 25 Drawing Sheets

PK1

(51) Int. Cl.

| | |
|---|---|
| ***H10W 70/685*** | (2026.01) |
| ***H10W 74/10*** | (2026.01) |
| ***H10W 90/00*** | (2026.01) |
| *H10W 70/60* | (2026.01) |
| *H10W 70/655* | (2026.01) |
| *H10W 70/656* | (2026.01) |
| *H10W 74/15* | (2026.01) |

(52) U.S. Cl.
CPC .......... *H10W 74/111* (2026.01); *H10W 90/00* (2026.01); *H10W 90/701* (2026.01); *H10W 70/60* (2026.01); *H10W 70/655* (2026.01); *H10W 70/656* (2026.01); *H10W 74/15* (2026.01); *H10W 90/722* (2026.01); *H10W 90/724* (2026.01); *H10W 90/734* (2026.01)

(58) Field of Classification Search
USPC .......................................................... 257/734
See application file for complete search history.

(56) References Cited

U.S. PATENT DOCUMENTS

| | | | |
|---|---|---|---|
| 9,013,038 B2 | 4/2015 | Chen et al. | |
| 11,145,611 B2 | 10/2021 | Kim et al. | |
| 2020/0035631 A1 | 1/2020 | Chang et al. | |
| 2022/0139860 A1 | 5/2022 | Lee et al. | |
| 2022/0246563 A1 | 8/2022 | Kim et al. | |
| 2022/0246568 A1* | 8/2022 | Lee | H01L 24/19 |

* cited by examiner

SEMICONDUCTOR PACKAGE HAVING A DOUBLE VIA

CROSS-REFERENCE TO RELATED APPLICATION

Korean Patent Application No. 10-2022-0145559, filed on Nov. 3, 2022, in the Korean Intellectual Property Office, is incorporated by reference herein in its entirety.

BACKGROUND

1. Field

A semiconductor package is disclosed.

2. Description of the Related Art

Due to the rapid developments of the electronics industry and demands of users, electronic devices are becoming smaller and lighter, having more functions, and having higher capacity, and thus highly integrated semiconductor chips are demanded.

SUMMARY

Embodiments are directed to a semiconductor package, including a lower redistribution structure, including a redistribution insulation layer, a plurality of ball pads in the redistribution insulation layer apart from one another, a double via having a first active via and a dummy via located on at least one of the plurality of ball pads and apart from each other in the redistribution insulation layer, and a first active redistribution layer electrically connected to the first active via in the redistribution insulation layer, solder balls electrically connected to the plurality of ball pads under the lower redistribution structure, a first semiconductor chip on the lower redistribution structure and electrically connected to the first active via and the first active redistribution layer of the lower redistribution structure, and a molding layer molding the first semiconductor chip on the lower redistribution structure.

Embodiments are directed to a semiconductor package, including a lower redistribution structure having a fan-in region and a fan-out region, the lower redistribution structure including a redistribution insulation layer, a plurality of ball pads in the redistribution insulation layer apart from one another, first active vias electrically connected to the plurality of ball pads, and a first active redistribution layer electrically connected to the first active vias, solder balls electrically connected to the plurality of ball pads under the lower redistribution structure, a first semiconductor chip on the fan-in region of the lower redistribution structure and electrically connected to the first active vias and the first active redistribution layer of the lower redistribution structure, and a molding layer molding the first semiconductor chip on the fan-out region of the lower redistribution structure, wherein the lower redistribution structure further includes a dummy via on at least one ball pad from among the plurality of ball pads in the fan-out region, and a double via including a first active via and the dummy via spaced apart from each other is on the at least one ball pad of the fan-out region.

Embodiments are directed to a semiconductor package, including a lower semiconductor package having a lower redistribution structure having a fan-in region and a fan-out region, the lower redistribution structure including a redistribution insulation layer, a plurality of ball pads in the redistribution insulation layer apart from one another, first active vias electrically connected to the plurality of ball pads, and a first active redistribution layer electrically connected to the first active vias, solder balls electrically connected to the plurality of ball pads under the lower redistribution structure, a first semiconductor chip on the fan-in region of the lower redistribution structure and electrically connected to the first active vias and the first active redistribution layer of the lower redistribution structure, a lower molding layer molding the first semiconductor chip on the fan-out region of the lower redistribution structure, a redistribution connection via penetrating through an upper portion and a lower portion of the lower molding layer, an upper redistribution structure being positioned on the lower molding layer, the redistribution connection via, and the first semiconductor chip, and electrically connected to the lower redistribution structure through the redistribution connection via, and a dummy via on at least one of the plurality of ball pads in the fan-out region, the first active via and the dummy via being spaced apart from each other on the at least one of the plurality of ball pads in the fan-out region, and an upper semiconductor package mounted on the lower semiconductor package including a second semiconductor chip electrically connected to an upper redistribution structure and an upper molding layer molding the second semiconductor chip.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
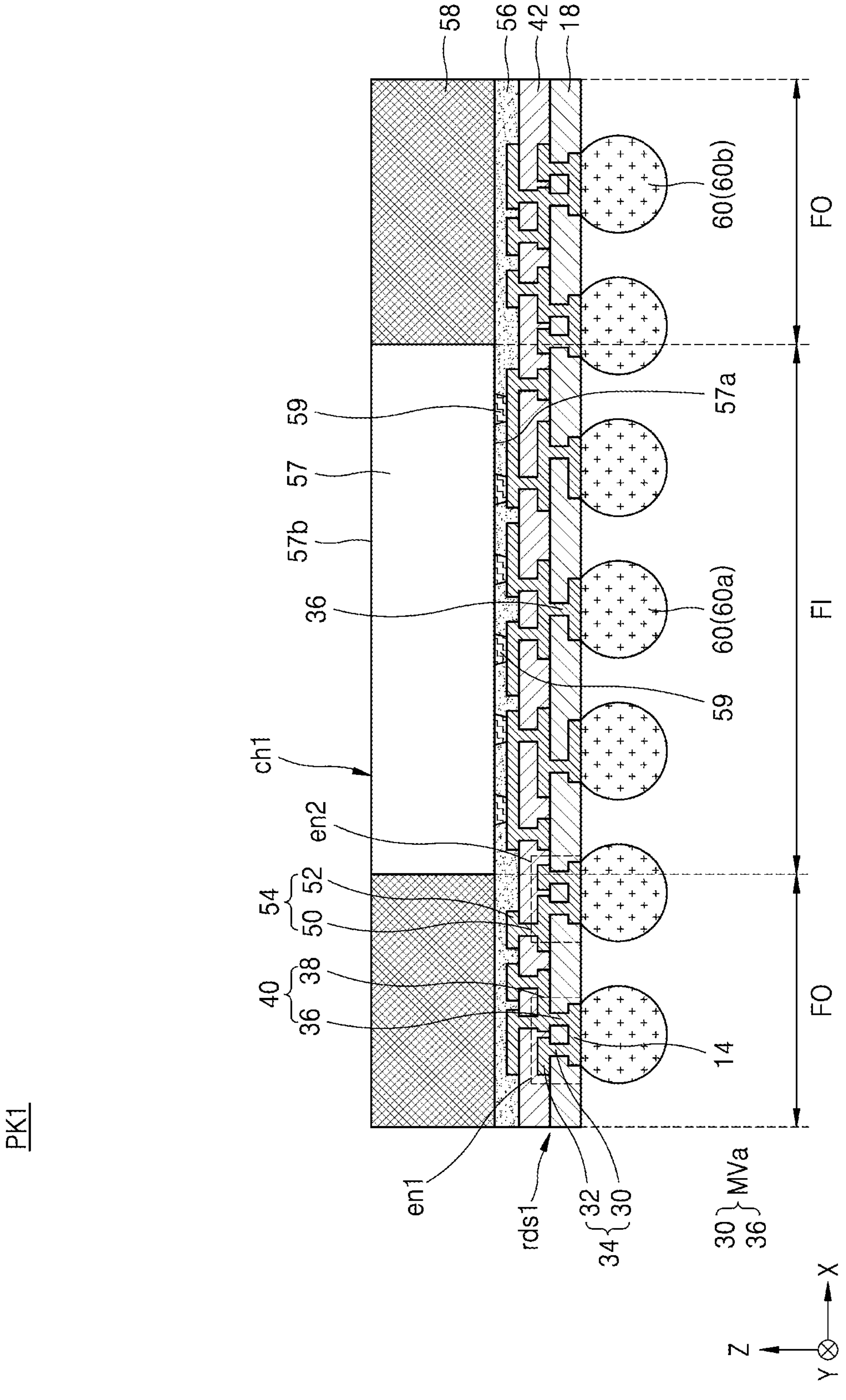
FIG. 1 is a cross-sectional view of a semiconductor package according to an example embodiment.
Figure 2:
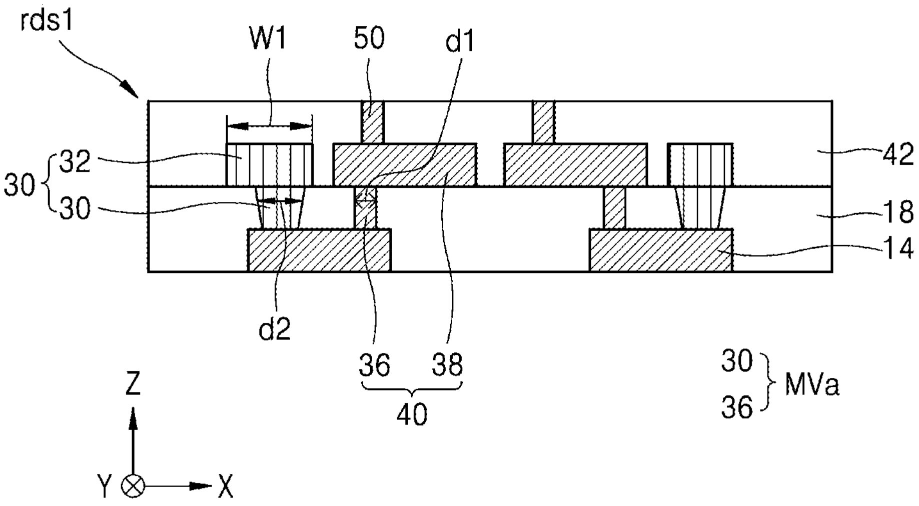
FIG. 2 is a partially enlarged view of the semiconductor package of FIG. 1.

FIG. 1 is a cross-sectional view of a semiconductor package according to an example embodiment, and FIG. 2 is a partially enlarged view of the semiconductor package of FIG. 1.

A semiconductor package PK1 may include a lower redistribution structure rds1, a first semiconductor chip ch1, a molding layer 58, and solder balls 60. In the drawings below, a first direction (X direction) and a second direction (Y direction) may be directions horizontal to the surface of the lower redistribution structure rds1. The first direction (X direction) and the second direction (Y direction) may be a first horizontal direction and a second horizontal direction that may be horizontal to the surface of the lower redistribution structure rds1, respectively. A third direction (Z direction) may be a vertical direction perpendicular to the surface of the lower redistribution structure rds1.

FIG. 2 may be an enlarged view of a first portion en1 and a second portion en2 of the semiconductor package PK1 of FIG. 1. FIG. 2 shows configurations of the first portion en1 and the second portion en2 of FIG. 1. The first portion en1 and the second portion en2 may have a mirror-symmetrical structure in the first direction (X direction).

The semiconductor package PK1 may include the lower redistribution structure rds1 extending to the outside of (or around) the first semiconductor chip ch1. Therefore, the semiconductor package PK1 may be a fan-out semiconductor package. Furthermore, the semiconductor package PK1 may be a wafer-level package that may be manufactured at the wafer level.

Collectively, the semiconductor package PK1 may be a fan-out wafer level package (FOWLP). Hereinafter, the structure of the semiconductor package PK1 will be described in detail.

The lower redistribution structure rds1 may include a fan-in region FI and a fan-out region FO. The fan-in region FI may be a region in which the first semiconductor chip ch1 may be mounted. The fan-out region FO may be located on both sides of the fan-in region FI. The fan-out region FO may surround the fan-in region FI when viewed from above. The molding layer 58 may be on the fan-out region FO.

The lower redistribution structure rds1 may include a first redistribution insulation layer 18, a second redistribution insulation layer 42, and a third redistribution insulation layer 56. The second redistribution insulation layer 42 and the third redistribution insulation layer 56 may be sequentially on the first redistribution insulation layer 18.

The first redistribution insulation layer 18, the second redistribution insulation layer 42, and the third redistribution insulation layer 56 may include an insulating polymer or a silicon-containing insulating material. The insulating polymer may include, e.g., photosensitive polyimide (PSPI), polybenzoxazole (PBO), phenolic polymer, or benzocyclobutene-based polymer (BCB). The silicon-containing insulating material may include silicon oxide, silicon nitride, silicon oxynitride, or tetraethyl orthosilicate (TEOS). As used herein, the term "or" is not an exclusive term, e.g., "A or B" would include A, B, or A and B.

A ball pad 14 may be installed in the first redistribution insulation layer 18. The ball pad 14 may be referred to as a ball land. The ball pad 14 may include an input and output ball pad, a power ball pad, and a ground ball pad. A plurality of ball pads 14 may be provided. The plurality of ball pads 14 may be insulated from each other by the first redistribution insulation layer 18. The plurality of ball pads 14 may be in the fan-in region FI and the fan-out region FO. A solder ball 60 that may be connected to an external electronic device may be under the ball pad 14. A plurality of solder balls 60 may be provided.

The solder ball 60 may be an external connection terminal that may be connected to an external electronic device. The solder ball 60 may include a metal e.g. nickel (Ni), gold (Au), silver (Ag), aluminum (Al), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), or ruthenium (Ru). External connection terminals may include not only solder balls as in the present embodiment, but also solder bumps or solder pillars.

A double via MVa which may include a dummy via 30 and a first active via 36 may be on each of the plurality of ball pads 14 in the fan-out region FO and each of the plurality of ball pads 14 at a boundary (e.g., a boundary region) between the fan-in region FI and the fan-out region FO. In other words, the double via MVa may be located in a region near an edge of the first semiconductor chip ch1. A single first active via 36 may be on each of the plurality of ball pads 14 of the fan-in region FI.

The dummy via 30 and the first active via 36 may be insulated from each other by the first redistribution insulation layer 18. FIG. 1 shows that double vias MVa may be in the fan-out region FO and at the boundary between the fan-in region FI and the fan-out region FO.

The solder balls 60 may be divided into first solder balls **60*a* under single first active vias 36 and second solder balls 60*b* under the double vias MVa. The first solder balls 60*a* may be in the fan-in region FI. The second solder balls 60*b*** may be in the fan-out region FO and the boundary between the fan-in region FI and the fan-out region FO.

As shown in FIG. 2, the double via MVa may include the dummy via 30 and the first active via 36 spaced apart from each other on the ball pad 14. The first active via 36 may have a first diameter d1. The dummy via 30 may have a second diameter d2 greater than the first diameter d1. In other words, the dummy via 30 may have a second diameter d2 larger than the first diameter d1. According to some embodiments, both sidewalls of the dummy via 30 may be inclined.

The first diameter d1 and the second diameter d2 may each be from dozens of micrometers (um) to hundreds of um. In an implementation, the first diameter d1 may be from about 20 um to about 200 um. The second diameter d2 may be from about 30 um to about 250 um.

A dummy redistribution layer 32 may be in the second redistribution insulation layer 42 on the dummy via 30. The dummy redistribution layer 32 may have a first width w1. The first width w1 may be from dozens of um to hundreds of um. The first width w1 may be from about 40 um to about 400 um.

The dummy via 30 and the dummy redistribution layer 32 may constitute a dummy redistribution structure 34. The dummy via 30 and the dummy redistribution layer 32 constituting the dummy redistribution structure 34 may be dummy structures that may not be electrically operated because they may not be connected to the active redistribution layer.

The dummy via 30 may be a support via for increasing adhesion between the first redistribution insulation layer 18 and the ball pad 14. The dummy via 30 may be a support via for stably supporting the ball pad 14 and the second solder ball 60*b*.

By forming the dummy via 30, the ball pad 14 may be prevented from being peeled off or cracked during a temperature cycling test or a reliability test of the semiconductor package PK1. Therefore, in the semiconductor package PK1, the reliability of the lower redistribution structure rds1 may be improved by forming the dummy via 30, and thus the reliability of the semiconductor package PK1 may also be improved.

A first active redistribution layer 38 may be in the second redistribution insulation layer 42 on the first active via 36. The first active via 36 and the first active redistribution layer 38 may constitute a first active redistribution structure 40.

The first active redistribution structure 40 may be an active structure electrically operated by being connected to a second active via 50 included in the second redistribution insulation layer 42. As shown in FIG. 2, the dummy redistribution structure 34 may be on the left side or the right side of the first active redistribution structure 40 in the first direction (X direction; the first horizontal direction).

As shown in FIG. 1, the second active via 50 connected to the first active redistribution layer 38 of the first active redistribution structure 40 may be in the second redistribution insulation layer 42 of the semiconductor package PK1.

The first active redistribution layer 38 and the second active via 50 may be insulated from each other by the second redistribution insulation layer 42. A second active redistribution layer 52 may be in the third redistribution insulation layer 56 on the second active via 50. The second active redistribution layer 52 may include a plurality of second active redistribution layers. The second active redistribution layers may be insulated from each other by the third redistribution insulation layer 56. The second active via 50 and the second active redistribution layer 52 may constitute a second active redistribution structure 54.

According to the present embodiment, the ball pad 14, the dummy via 30, the dummy redistribution layer 32, the first active via 36, the first active redistribution layer 38, the second active via 50, and the second active redistribution layer 52 may include a metal layer including a metal e.g. gold, copper, nickel, stainless steel, or beryllium copper. In the present embodiment, the lower redistribution structure rds1 may include three redistribution insulation layers 18, 42, and 56. The lower redistribution structure rds1 may include more or fewer redistribution insulation layers as needed.

The first semiconductor chip ch1 may be in the fan-in region FI of the lower redistribution structure rds1. A first chip connection terminal 59 may be at the lower portion of the first semiconductor chip ch1. The first semiconductor chip ch1 may be electrically connected to the lower redistribution structure rds1 through the first chip connection terminal 59. A plurality of first chip connection terminals 59 may be provided. The first chip connection terminal 59 may include a solder ball, a solder bump, or a solder pillar.

The first semiconductor chip ch1 may include a first semiconductor substrate 57. The first semiconductor substrate 57 may include a semiconductor element e.g., germanium (Ge) or a compound semiconductor e.g., silicon carbide (SiC), gallium arsenide (GaAs), indium arsenide (InAs), or indium phosphide (InP). The first semiconductor substrate 57 may have a silicon-on-insulator (SOI) structure.

The first semiconductor substrate 57 may include a conductive region, e.g., a well doped with an impurity. The first semiconductor substrate 57 may have various device isolation structures e.g., a shallow trench isolation (STI) structure.

The first semiconductor substrate 57 may have a bottom surface 57*a* and a top surface 57*b*. The bottom surface 57*a* of the first semiconductor substrate 57 may be an active surface on which active elements may be formed, and the top surface 57*b* of the first semiconductor substrate 57 may be an inactive surface on which active elements may not be formed. A plurality of individual devices of various types may be on the bottom surface 57*a* of the first semiconductor substrate 57.

The plurality of individual devices may include various microelectronic devices, e.g., a metal-oxide-semiconductor field effect transistor (MOSFET) e.g., a complementary metal-insulator-semiconductor transistor (CMOS transistor), a system large scale integration (LSI), an image sensor e.g., a CMOS imaging sensor (CIS), a micro-electro-mechanical system (MEMS), an active device, or a passive device.

According to some embodiments, the first semiconductor chip ch1 may be a logic chip, e.g., a central processor unit (CPU) chip, a microprocessor unit (MPU) chip, a graphics processor unit (GPU) chip, or an application processor (AP) chip.

The molding layer 58 may be on both sidewalls of the first semiconductor chip ch1. The top surface of the molding layer 58 may be coplanar with the top surface 57*b* of the first semiconductor substrate 57. The molding layer 58 may protect the both sidewalls of the first semiconductor chip ch1. The molding layer 58 may include an insulating polymer. According to some embodiments, the molding layer 58 may include an epoxy molding compound (EMC).

As described above, the semiconductor package PK1 may include the double via MVa having the first active via 36 and the dummy via 30 on the ball pad 14 in the lower redistribution structure rds1. Therefore, the semiconductor package PK1 may improve the adhesion between the first redistribution insulation layer 18 and the ball pad 14 due to the dummy via 30 constituting the double via MVA, thereby improving the reliability of the lower redistribution structure rds1.

Figure 3:
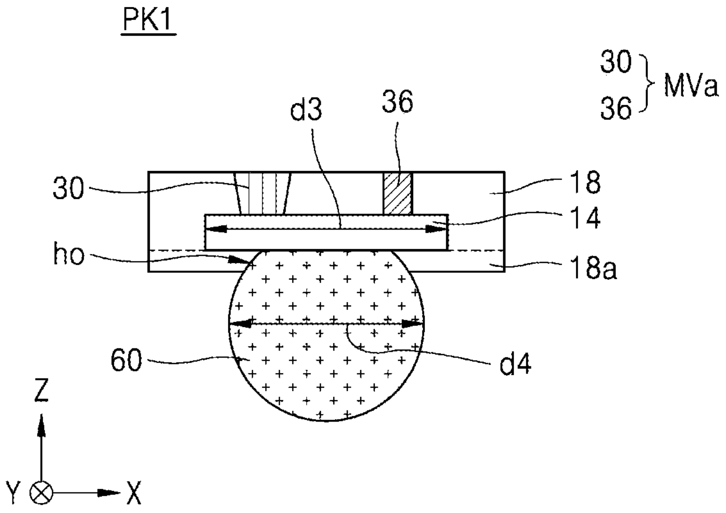
FIG. 3 is an enlarged view for describing a connection relationship between a ball pad and a solder ball of the semiconductor package of FIGS. 1 and 2.

FIG. 3 is an enlarged view for describing a connection relationship between a ball pad and a solder ball of the semiconductor package of FIGS. 1 and 2.

The semiconductor package PK1 may include the ball pad 14 and the solder ball 60 on the bottom surface of the ball pad 14. A third diameter d3 of the ball pad 14 may be about 500 um or less. In an implementation, the third diameter d3 of the ball pad 14 may be from about 200 um to about 500 um.

A fourth diameter d4 of the solder ball 60 may be smaller than the third diameter d3 of the ball pad 14. In an implementation, the fourth diameter d4 of the solder ball 60 may be about 450 um or less. The solder ball 60 may be inside an exposure hole ho, which may be in a portion 18*a* of the first redistribution insulation layer 18 and may expose the ball pad 14. According to some embodiments, the diameter of the exposure hole ho may be equal to the fourth diameter d4.

As such, the solder ball 60 may have a solder mask defined (SMD) shape in which the fourth diameter d4 may be smaller than the third diameter d3 of the ball pad 14. Furthermore, the double via MVa including the dummy via 30 and the first active via 36 may be on the ball pad 14 above the solder ball 60. As described above, only the first active via 36 may be on the ball pad 14 above the solder ball 60.

Figure 4:
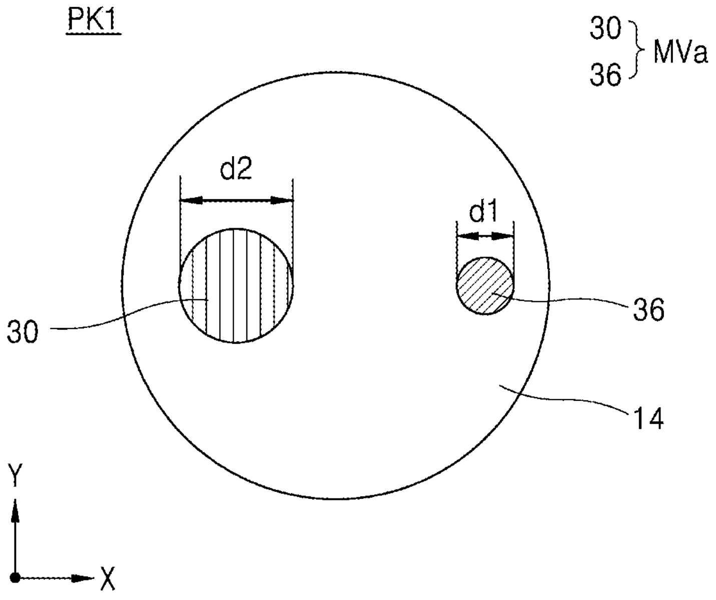
FIG. 4 is an enlarged plan view for describing a ball pad and a double via of a semiconductor package according to an example embodiment.
Figure 5:
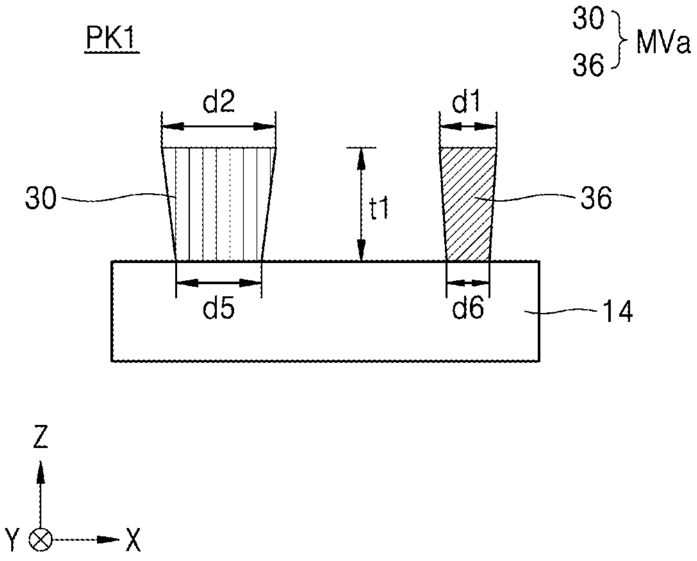
FIG. 5 is an enlarged cross-sectional view for describing a ball pad and a double via of a semiconductor package according to an example embodiment

FIG. 4 is an enlarged plan view for describing a ball pad and a double via of a semiconductor package according to an example embodiment, and FIG. 5 is an enlarged cross-sectional view for describing a ball pad and a double via of a semiconductor package according to an example embodiment.

The semiconductor package PK1 may include the ball pad 14 and the double via MVa having the dummy via 30 and the first active via 36. As shown in FIG. 4, the dummy via 30 and the first active via 36 may be on a plane on the ball pad 14, that is, on a plane in the X direction (first horizontal direction) and the Y direction (second horizontal direction). The dummy via 30 and the first active via 36 may be spaced apart from each other in the first direction (X direction; first horizontal direction). As described above, the dummy via 30 may have the second diameter d2.

As described above, the first active via 36 may have the first diameter d1 smaller than the second diameter d2. In FIG. 4, the dummy via 30 and the first active via 36 may be sequentially arranged in the first direction (X direction; first horizontal direction). However, the dummy via 30 and the first active via 36 may also be sequentially arranged in a first reverse direction (−X direction).

As shown in FIG. 5, the dummy via 30 and the first active via 36 may be on the ball pad 14 in the vertical direction (Z direction). The diameter of the dummy via 30 may decrease downward. According to some embodiments, the upper portion of the dummy via 30 may have the second diameter d2, and the lower portion of the dummy via 30 may have a fifth diameter d5. The fifth diameter d5 may be smaller than the second diameter d2 by several um.

As described above, the first active via 36 may have the first diameter d1 smaller than the second diameter d2. FIGS. 1 and 2 show that the upper portion and the lower portion of the first active via 36 may have the same diameter. According to some embodiments, the diameter of the first active via 36 may decrease in a direction from the upper portion of the first active via 36 toward the lower portion of the first active via 36 as shown in FIG. 5. The upper portion of the first active via 36 may have the first diameter d1, and the lower portion of the first active via 36 may have a sixth diameter d6. The sixth diameter d6 may be smaller than the first diameter d1 by several um.

The dummy via 30 and the first active via 36 may each have a first thickness t1. The first thickness t1 may be dozens of um. In an implementation, the first thickness t1 may be from about 2 um to about 10 um.

In FIG. 5, the dummy via 30 and the first active via 36 may be apart from each other in the first direction (X direction). However, the dummy via 30 and the first active via 36 may also be sequentially arranged apart from each other in the first reverse direction (−X direction).

Figure 6:
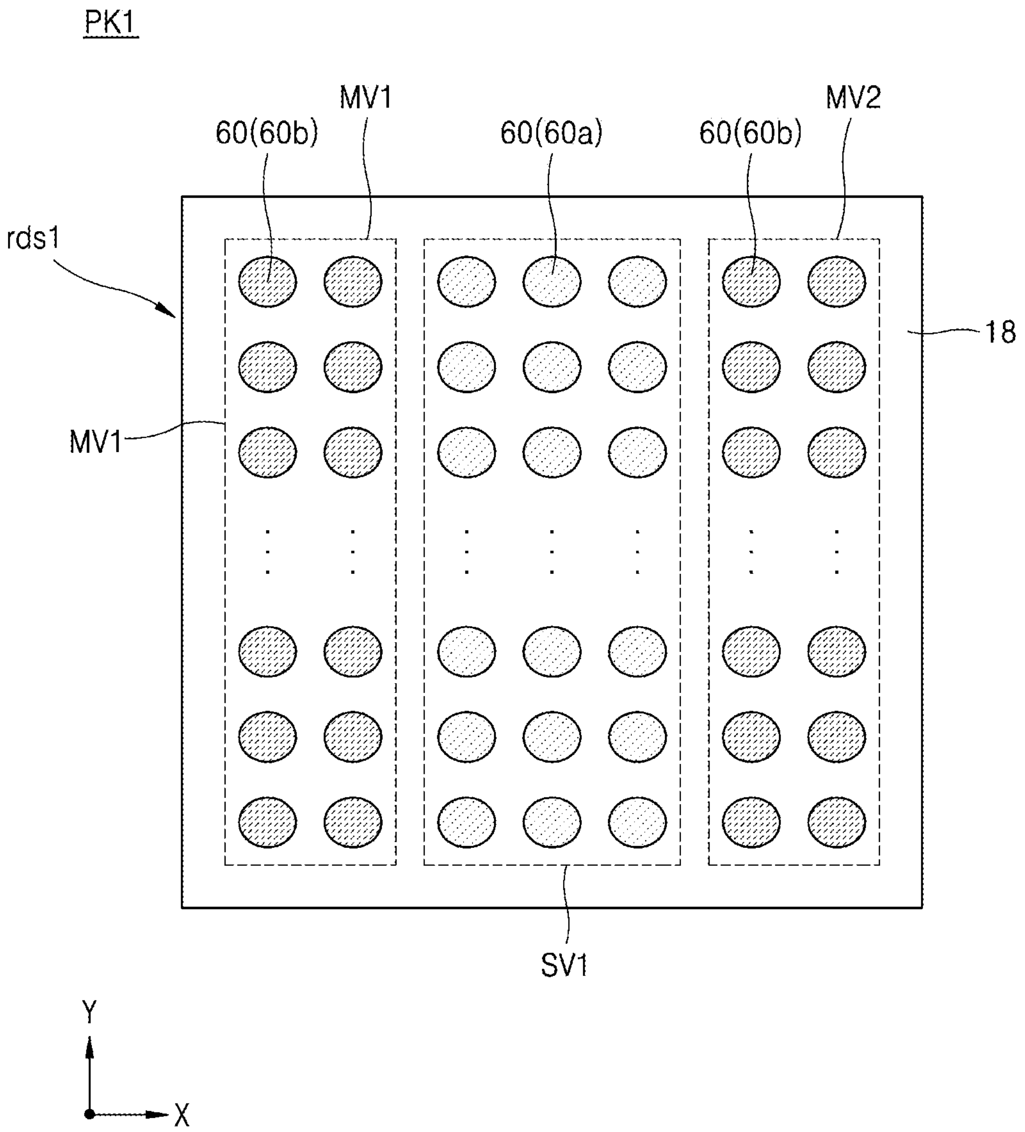
FIG. 6 is a plan view showing the arrangement of solder balls in a semiconductor package according to an example embodiment.

FIG. 6 is a plan view showing the arrangement of solder balls in a semiconductor package according to an example embodiment. FIG. 6 may be a plan view of the semiconductor package PK1 including an example arrangement of the solder balls 60 of the lower redistribution structure rds1 shown in FIGS. 1 to 5. The plan view of FIG. 6 may be a plan view of the ball pad 14. In FIG. 6, descriptions identical to those given above with reference to FIGS. 1 to 5 will be briefly given or omitted.

The lower redistribution structure rds1 may have an X-Y plane extending in the first direction (X direction; first horizontal direction) and the second direction (Y direction; second horizontal direction). The lower redistribution structure rds1 may include the first redistribution insulation layer 18 on the X-Y plane extending in the first direction (X direction) and the second direction (Y direction). The plurality of solder balls 60 may be in the first redistribution insulation layer 18.

The plurality of solder balls 60 may be spaced apart from one another in the first direction (X direction) and the second direction (Y direction). The solder balls 60 may be divided into the first solder balls 60*a* under first active vias (36 of FIG. 1) and the second solder balls 60*b* under double vias (MVa of FIG. 1).

The first solder ball 60*a* may be located in a central region SV1 of the lower redistribution structure rds1 when viewed from above. The first solder balls 60*a* may be in a plurality of columns spaced apart from one another in the first direction (X direction) and extending in the second direction (Y direction) in the central region SV1 of the X-Y plane of the lower redistribution structure rds1. A plurality of first solder balls 60*a* may be in the second direction (Y direction) in one column.

The second solder balls 60*b* may be located in a left peripheral region MV1 and a right peripheral region MV2 of the lower redistribution structure rds1 when viewed from above. The second solder balls 60*b* may be located in the left peripheral region MV1 and the right peripheral region MV2 around the central region SV1 when viewed from above. A plurality of second solder balls 60*b* may be in the second direction (Y direction) in one column. According to some embodiments, unlike in FIG. 6, the second solder ball 60*b* may be located only in one of the left peripheral region MV1 and the right peripheral region MV2 of the lower redistribution structure rds1 when viewed from above. According to some embodiments, hundreds or thousands of the solder balls 60 may be arranged, and dozens or hundreds of the solder balls 60 may be in the left peripheral region MV1 and the right peripheral region MV2.

Figure 7:
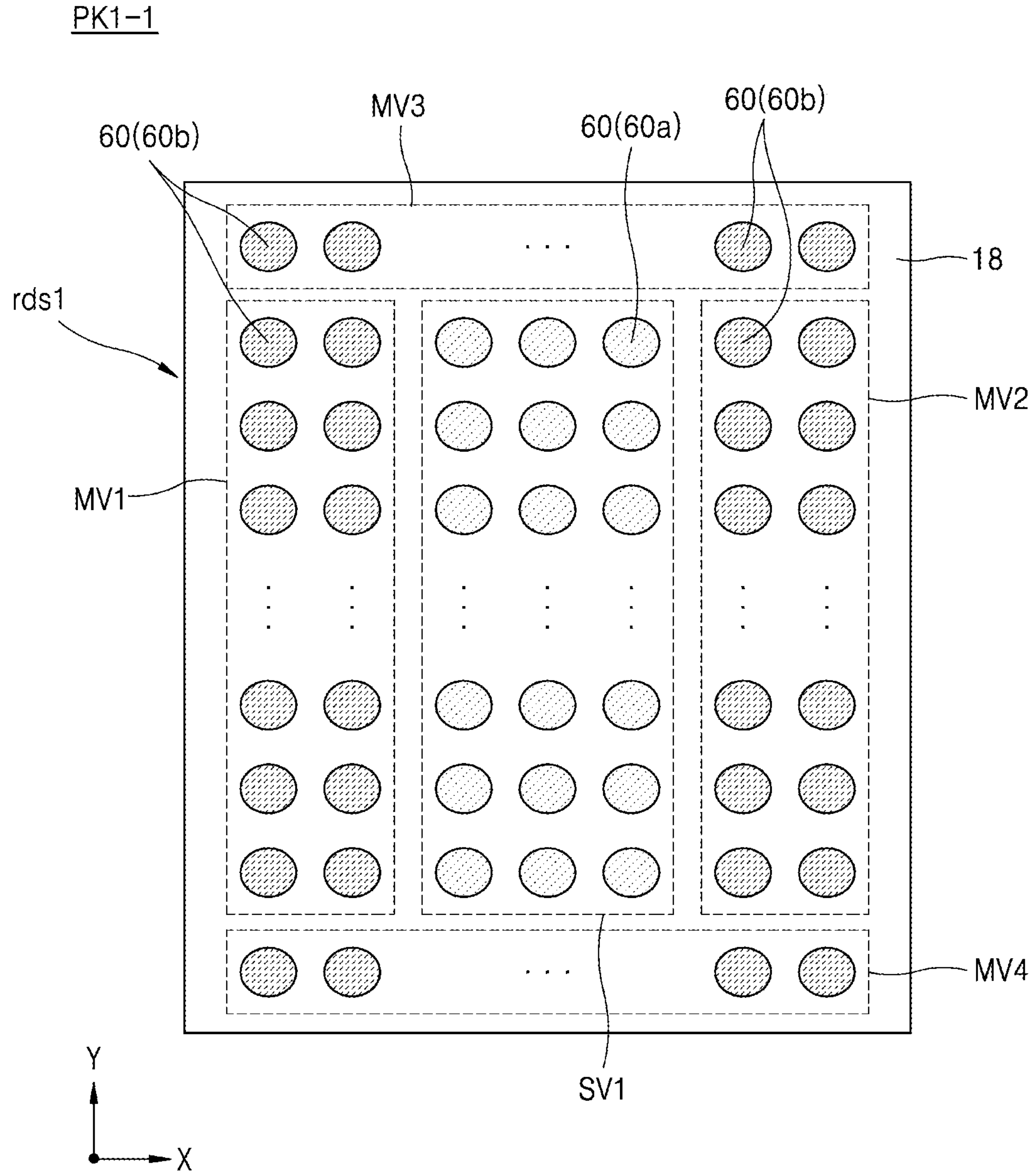
FIG. 7 is a plan view showing the arrangement of solder balls in a semiconductor package according to an example embodiment.

FIG. 7 is a plan view showing the arrangement of solder balls in a semiconductor package according to an example embodiment. FIG. 7 may be a plan view of a semiconductor package PK1-1 including another example arrangement of the solder balls 60 of the lower redistribution structure rds1 of the semiconductor package PK1 shown in FIGS. 1 to 6. The plan view of FIG. 7 may be a plan view of the ball pad 14.

The semiconductor package PK1-1 may be identical to the semiconductor package PK1 of FIG. 6 except that the second solder balls 60*b* may be in an upper peripheral region MV3 and a lower peripheral region MV4 of the lower redistribution structure rds1. In FIG. 7, descriptions identical to those given above with reference to FIGS. 1 to 6 will be briefly given or omitted.

In the lower redistribution structure rds1, the solder balls 60 may be on the X-Y plane extending in the first direction (X direction; first horizontal direction) and the second direction (Y direction; second horizontal direction). The plurality of solder balls 60 may be spaced apart from one another in the first direction (X direction) and the second direction (Y direction). The solder balls 60 may be divided into the first solder balls 60*a* under first active vias (36 of FIG. 1) and the second solder balls 60*b* under double vias (MVa of FIG. 1).

The first solder ball 60*a* may be located in a central region SV1 of the lower redistribution structure rds1 when viewed from above. The second solder balls 60*b* may be located in the left peripheral region MV1 and the right peripheral region MV2 of the lower redistribution structure rds1 when viewed from above. The second solder balls 60*b* may be located in the upper peripheral region MV3 and the lower peripheral region MV4 of the lower redistribution structure rds1 when viewed from above.

A plurality of second solder balls 60*b*, e.g., dozens to hundreds of the second solder balls 60*b*, may be in the first direction (X direction) in one row. According to some embodiments, unlike in FIG. 6, the second solder ball 60*b* may be located only in one of the upper peripheral region MV3 and the lower peripheral region MV4 of the lower redistribution structure rds1 when viewed from above.

Figure 8:
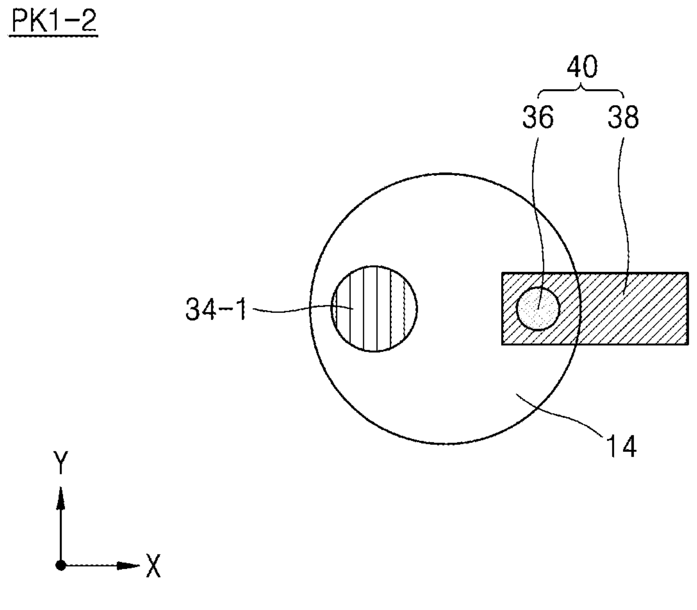
FIG. 8 is an enlarged plan view for describing a dummy redistribution structure and a first active redistribution structure of a semiconductor package according to an example embodiment.

FIG. 8 is an enlarged plan view for describing a dummy redistribution structure and a first active redistribution structure of a semiconductor package according to an example embodiment.

A semiconductor package PK1-2 may be substantially the same as the semiconductor package PK1 of FIGS. 1 to 6 except for a different arrangement of a dummy redistribution structure 34-1. In FIG. 8, descriptions identical to those given above with reference to FIGS. 1 to 6 will be briefly given or omitted.

The semiconductor package PK1-2 may include the ball pad 14, the dummy redistribution structure 34-1, and the first active redistribution structure 40. The dummy redistribution structure 34-1 may be located in the ball pad 14. The first active redistribution structure 40 may include the first active via 36 and the first active redistribution layer 38. The first active via 36 may be located in the ball pad 14. The first active redistribution layer 38 may be on the first active via 36 and extend in the first direction (X direction; first horizontal direction), and thus the first active redistribution layer 38 may be located outside the ball pad 14.

Figure 9:
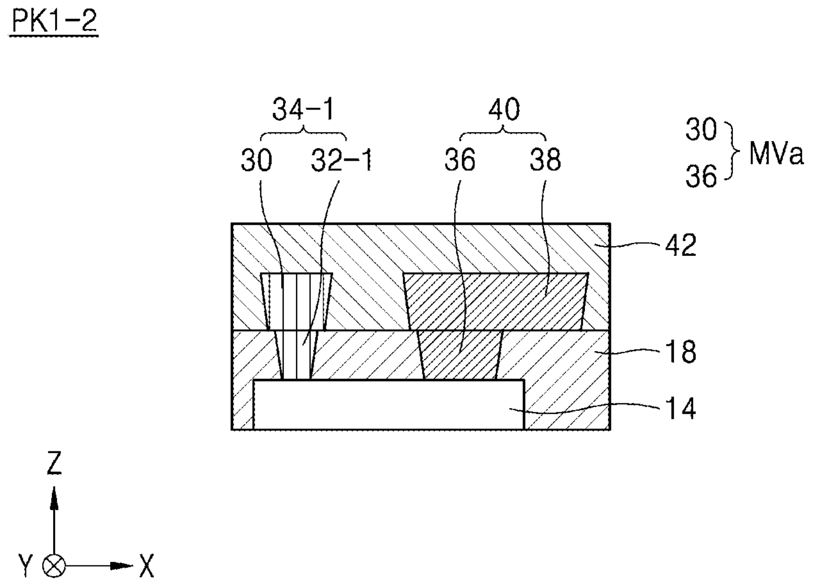
FIG. 9 is an enlarged cross-sectional view for describing a dummy redistribution structure and a first active redistribution structure of a semiconductor package according to an example embodiment.

FIG. 9 is an enlarged cross-sectional view for describing a dummy redistribution structure and a first active redistribution structure of a semiconductor package according to an example embodiment.

A semiconductor package PK1-2 may be substantially the same as the semiconductor package PK1 of FIGS. 1 to 6 except for the structure of the dummy redistribution structure 34-1. FIG. 9 may be a cross-sectional view in the first direction (X direction) of FIG. 8. In FIG. 9, descriptions identical to those given above with reference to FIGS. 1 to 6 will be briefly given or omitted.

In the semiconductor package PK1-2, the dummy via 30 and a dummy redistribution layer 32-1 may be sequentially on the ball pad 14. The dummy redistribution layer 32-1 may be only on the dummy via 30. The dummy via 30 and the dummy redistribution layer 32-1 may constitute the dummy redistribution structure 34-1.

Furthermore, the first active via 36 and the first active redistribution layer 38 may be sequentially on the ball pad 14. The first active redistribution layer 38 may be on the first active via 36 and may extend in the first direction (X direction). The double via MVa may be on the ball pad 14.

The double via MVa may include the dummy via 30 and the first active via 36 spaced apart from each other. The dummy via 30 and the first active via 36 may be insulated from each other by the first redistribution insulation layer 18. The first dummy redistribution layer 32-1 and the first active redistribution layer 38 may be insulated from each other by the second redistribution insulation layer 42.

Figure 10:
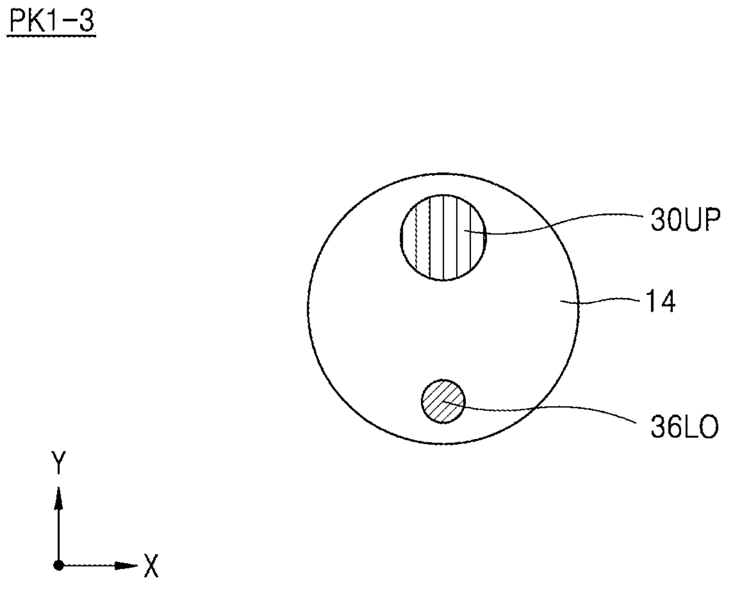
FIG. 10 is an enlarged plan view for describing the arrangement of a dummy via and a first active via in a semiconductor package according to an example embodiment.

FIG. 10 is an enlarged plan view for describing the arrangement of a dummy via and a first active via in a semiconductor package according to an example embodiment.

A semiconductor package PK1-3 may be substantially the same as the semiconductor package PK1 of FIGS. 1 to 6 except for a different arrangement of an upper dummy via 30UP and a lower first active via 36LO. In FIG. 10, descriptions identical to those given above with reference to FIGS. 1 to 6 will be briefly given or omitted.

The semiconductor package PK1-3 may include the ball pad 14, the upper dummy via 30UP, and the lower first active via 36LO. The upper dummy via 30UP may correspond to the dummy via 30 of FIGS. 4 and 5. The lower first active via 36LO may correspond to the first active via 36 of FIGS. 4 and 5.

The upper dummy via 30UP may be in the upper portion of the ball pad 14. The lower first active via 36LO may be in the lower portion of the ball pad 14. The lower first active via 36LO and the upper dummy via 30UP may be sequentially in the second direction (Y direction; second horizontal direction). The upper dummy via 30UP may be spaced apart from the lower first active via 36LO in the second direction (Y direction).

According to some embodiments, the upper dummy via 30UP and the lower first active via 36LO may be sequentially arranged in the second direction (Y direction) differently from the arrangement of FIG. 10. In other words, the upper dummy via 30UP may be spaced apart from the lower first active via 36LO in a second reverse direction (−Y direction).

Figure 11:
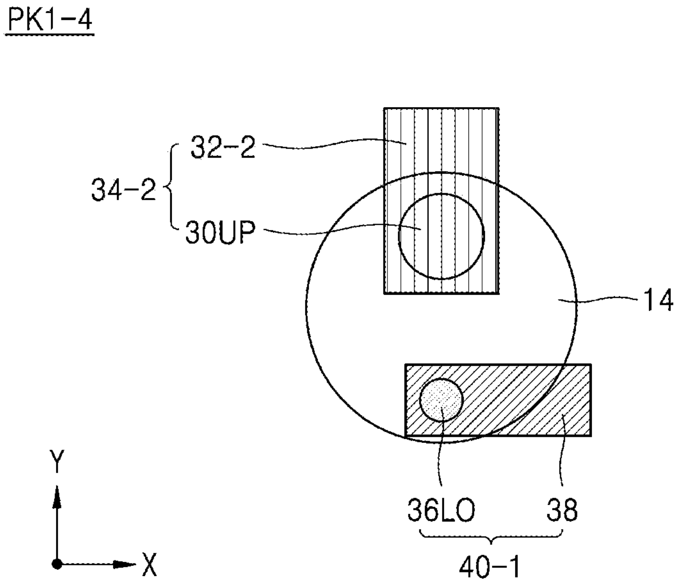
FIG. 11 is an enlarged plan view for describing the arrangement of a dummy redistribution structure and a first active redistribution structure of a semiconductor package according to an example embodiment.

FIG. 11 is an enlarged plan view for describing the arrangement of a dummy redistribution structure and a first active redistribution structure of a semiconductor package according to an example embodiment.

A semiconductor package PK1-4 may be identical to the semiconductor package PK1 of FIGS. 1 to 6 except that the upper dummy via 30UP and the lower first active via 36LO may be arranged differently and a dummy redistribution layer 32-2 and the first active redistribution layer 38 may be in the structure of the semiconductor package PK1-3 of FIG. 10. In FIG. 11, descriptions identical to those given above with reference to FIGS. 1 to 6 and 10 will be briefly given or omitted.

The semiconductor package PK1-4 may include the ball pad 14, a dummy redistribution structure 34-2, and a first lower first active redistribution structure 40-1. The dummy redistribution structure 34-2 may include the upper dummy via 30UP located in the ball pad 14 and the dummy redistribution layer 32-2, which may extend from the upper dummy via 30UP in the second direction (Y direction; second horizontal direction) and may be also located outside the ball pad 14.

The first active redistribution structure 40 may include the lower first active via 36LO and the first active redistribution layer 38. The lower first active via 36LO may be spaced apart from the upper dummy via 30UP in the second reverse direction (−Y direction) and located in the ball pad 14. The first active redistribution layer 38 may be on the first active via 36 and extends in the first direction (X direction; first horizontal direction) different from the second direction (second horizontal direction), and thus the first active redistribution layer 38 may also be located outside the ball pad 14.

Figure 12:
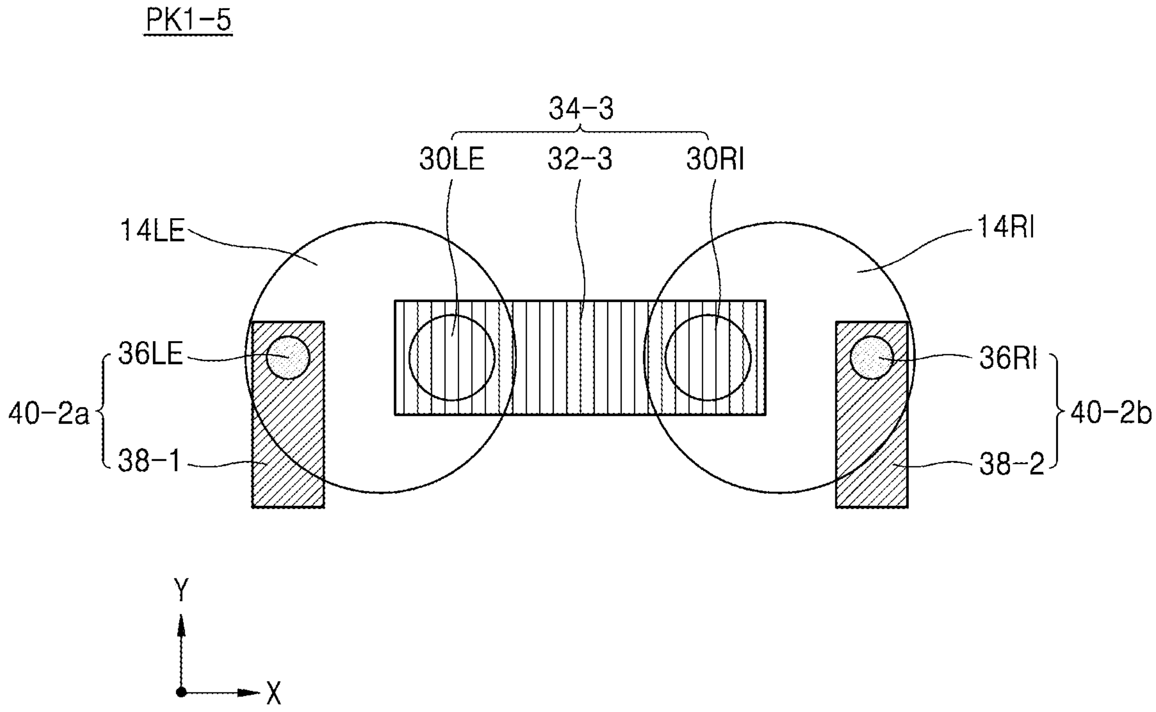
FIG. 12 is an enlarged plan view for describing a dummy redistribution structure and a first active redistribution structure of a semiconductor package according to an example embodiment.

FIG. 12 is an enlarged plan view for describing a dummy redistribution structure and a first active redistribution structure of a semiconductor package according to an example embodiment.

A semiconductor package PK1-5 may be substantially the same as the semiconductor package PK1 of FIGS. 1 to 6 except for different arrangements of a dummy redistribution structure 34-3 and left and right first active redistribution structures 40-2*a* and 40-2*b*. In FIG. 12, descriptions identical to those given above with reference to FIGS. 1 to 6 will be briefly given or omitted.

The semiconductor package PK1-5 may include ball pads 14LE and 14RI, the dummy redistribution structure 34-3, and the left and right first active redistribution structures 40-2*a* and 40-2*b*. The ball pads 14LE and 14RI may be either power ball pads or ground ball pads. The ball pads 14LE and 14RI may include a left ball pad 14LE and a right ball pad 14RI. In an implementation, the left ball pad 14LE and the right ball pad 14RI may be of the same type and may be power ball pads. Alternatively, the left ball pad 14LE and the right ball pad 14RI may be of the same type and may be ground ball pads.

The left ball pad 14LE and the right ball pad 14RI may be referred to as a first ball pad and a second ball pad located in the first direction (X direction; first horizontal direction), respectively. The left ball pad 14LE and the right ball pad 14RI may be spaced apart from each other in the first direction (X direction) on the X-Y plane.

A left first active via 36LE and a left dummy via 30LE may be in the left ball pad 14LE. The left first active via 36LE and the left dummy via 30LE may be spaced apart from each other in the first direction (X direction). The left dummy via 30LE may be spaced apart from the left first active via 36LE in the first direction (X direction). The left first active via 36LE and the left dummy via 30LE may be located in the left ball pad 14LE.

A left first active redistribution structure 40-2*a* may include the left first active via 36LE and a left first active redistribution layer 38-1. The left first active redistribution layer 38-1 may be connected to the left first active via 36LE. The left first active redistribution layer 38-1 may be on the left first active via 36LE and may extend in the second reverse direction (−Y direction), and thus the left first active redistribution layer 38-1 may also be located outside the left ball pad 14LE.

A right first active via 36RI and a right dummy via 30RI may be in the right ball pad 14RI. The right dummy via 30RI and the right first active via 36RI may be spaced apart from each other in the first direction (X direction). The right first active via 36RI may be spaced apart from the right dummy via 30RI in the first direction (X direction). The right dummy via 30RI and the right first active via 36RI may be located in the right ball pad 14RI.

A right first active redistribution structure 40-2*b* may include the right first active via 36RI and a right first active redistribution layer 38-2. The right first active redistribution layer 38-2 may be connected to the right first active via 36RI. The right first active redistribution layer 38-2 may be on the right first active via 36RI and may extend in the second reverse direction (−Y direction), and thus the right first active redistribution layer 38-2 may also be located outside the right ball pad 14RI.

The dummy redistribution structure 34-3 may include the left dummy via 30LE, the right dummy via 30RI, and a dummy redistribution layer 32-3. The dummy redistribution layer 32-3 may interconnect the left dummy via 30LE located on the left ball pad 14LE and the right dummy via 30RI located on the right ball pad 14RI. The dummy redistribution layer 32-3 may extend in the first direction (X direction) from the left dummy via 30LE and be connected to the right dummy via 30RI. In other words, the dummy redistribution layer 32-3 may extend in any one of a first horizontal direction and a second horizontal direction on two of the plurality of ball pads 14 to interconnect two dummy vias 30LE, 30RI. The dummy redistribution structure 34-3 may interconnect the left ball pad 14LE and the right ball pad 14RI.

Figure 13:
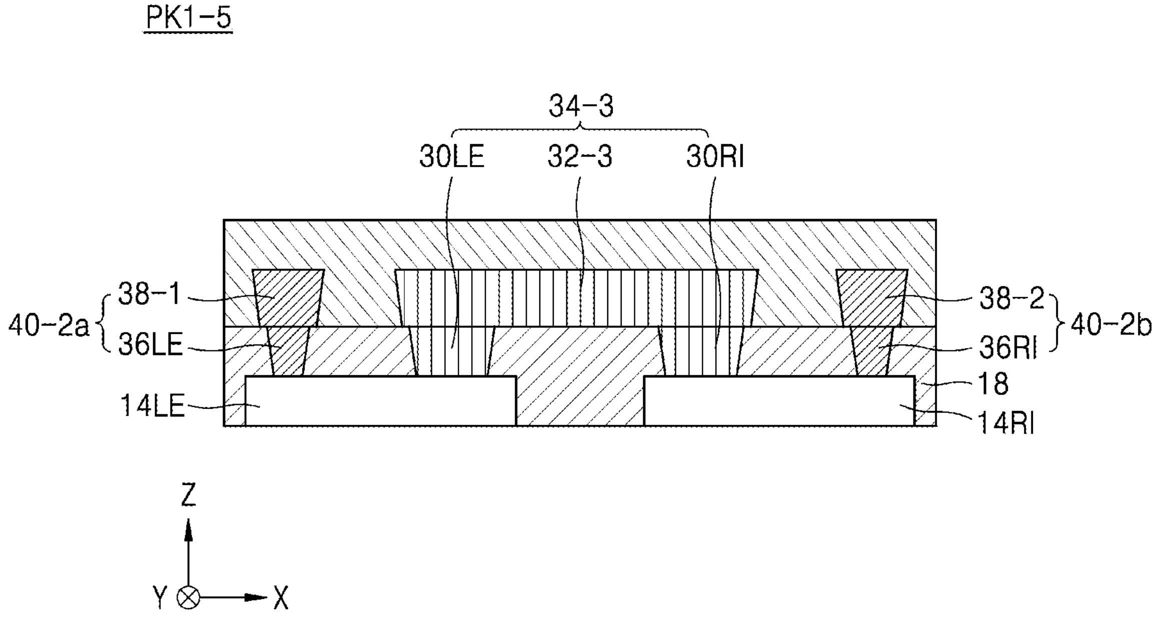
FIG. 13 is an enlarged cross-sectional view for describing a dummy redistribution structure and a first active redistribution structure of a semiconductor package according to an example embodiment.

FIG. 13 is an enlarged cross-sectional view for describing a dummy redistribution structure and a first active redistribution structure of a semiconductor package according to an example embodiment.

The semiconductor package PK1-5 may be substantially the same as the semiconductor package PK1 of FIGS. 1 to 6 except for different structures of a dummy redistribution structure 34-3 and left and right first active redistribution structures 40-2*a* and 40-2*b*. FIG. 13 may be a cross-sectional view in the first direction (X direction) of FIG. 12. In FIG. 13, descriptions identical to those given above with reference to FIGS. 1 to 6 will be briefly given or omitted.

In the semiconductor package PK1-5, the left first active via 36LE and the left dummy via 30LE may be on the left ball pad 14LE. The left first active via 36LE and the left dummy via 30LE may be spaced apart from each other in the first direction (X direction; first horizontal direction). The left first active redistribution layer 38-1 may be on the left first active via 36LE. The left first active redistribution structure 40-2*a* may include the left first active via 36LE and the left first active redistribution layer 38-1.

In the semiconductor package PK1-5, the right dummy via 30RI and the right first active via 36RI may be on the right ball pad 14RI. The right dummy via 30RI and the right first active via 36RI may be spaced apart from each other in the first direction (X direction; first horizontal direction). The right first active redistribution layer 38-2 may be on the right first active via 36RI. The right first active redistribution structure 40-2*b* may include the right first active via 36RI and the right first active redistribution layer 38-2.

The semiconductor package PK1-5 may include the dummy redistribution structure 34-3. The dummy redistribution structure 34-3 may include the left dummy via 30LE, the right dummy via 30RI, and the dummy redistribution layer 32-3. The dummy redistribution layer 32-3 may interconnect the left dummy via 30LE located on the left ball pad 14LE and the right dummy via 30RI located on the right ball pad 14RI.

The left first active via 36LE, the left dummy via 30LE, the right dummy via 30RI, and the right first active via 36RI may be insulated from one another by the first redistribution insulation layer 18. The left first active redistribution layer 38-1, the dummy redistribution layer 32-3, and the right first active redistribution layer 38-2 may be insulated from one another by the second redistribution insulation layer 42.

Figure 14:
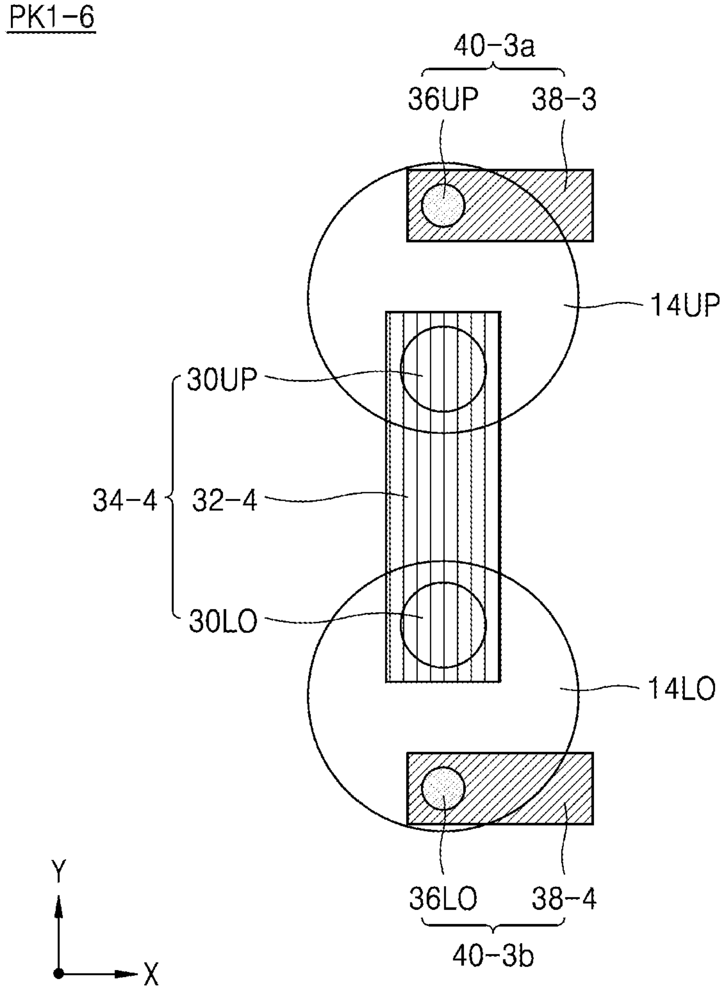
FIG. 14 is an enlarged plan view for describing a dummy redistribution structure and a first active redistribution structure of a semiconductor package according to an example embodiment.

FIG. 14 is an enlarged plan view for describing a dummy redistribution structure and a first active redistribution structure of a semiconductor package according to an example embodiment.

A semiconductor package PK1-6 may be substantially the same as the semiconductor package PK1 of FIGS. 1 to 6 except for different arrangements of a dummy redistribution structure 34-4 and upper and second lower first active redistribution structures 40-3*a* and 40-3*b*. In FIG. 14, descriptions identical to those given above with reference to FIGS. 1 to 6 will be briefly given or omitted.

The semiconductor package PK1-6 may include ball pads 14UP and 14LO, the dummy redistribution structure 34-4, and the upper and second lower first active redistribution structures 40-3*a* and 40-3*b*. The ball pads 14UP and 14LO may include an upper ball pad 14UP and a lower ball pad 14LO. The upper ball pad 14UP and the lower ball pad 14LO may be referred to as a first ball pad and a second ball pad located in the second direction (Y direction; second horizontal direction), respectively. The upper ball pad 14UP and the lower ball pad 14LO may be spaced apart from each other in the second direction (Y direction) on the X-Y plane.

An upper first active via 36UP and the upper dummy via 30UP may be in the upper ball pad 14UP. The upper first active via 36UP and the upper dummy via 30UP may be spaced apart from each other in the second direction (Y direction; second horizontal direction). The upper dummy via 30UP may be spaced apart from the upper first active via 36UP in the second reverse direction (−Y direction). The upper first active via 36UP and the upper dummy via 30UP may be located in the upper ball pad 14UP.

An upper first active redistribution structure 40-3*a* may include the upper first active via 36UP and an upper first active redistribution layer 38-3. The upper first active redistribution layer 38-3 may be connected to the upper first active via 36UP. The upper first active redistribution layer 38-3 may be on the upper first active via 36UP and may extend in the first direction (X direction), and thus the upper first active redistribution layer 38-3 may also be located outside the upper ball pad 14UP.

The lower first active via 36LO and a lower dummy via 30LO may be in the lower ball pad 14LO. The lower first active via 36LO and the lower dummy via 30LO may be spaced apart from each other in the second direction (Y direction). The lower first active via 36LO may be spaced apart from the lower dummy via 30LO in the second reverse direction (−Y direction). The lower first active via 36LO and the lower dummy via 30LO may be located in the lower ball pad 14LO.

A second lower first active redistribution structure 40-3*b* may include the lower first active via 36LO and a lower first active redistribution layer 38-4. The lower first active redistribution layer 38-4 may be connected to the lower first active via 36LO. The lower first active redistribution layer 38-4 may be on the lower first active via 36LO and may extend in the first direction (X direction), and thus the lower first active redistribution layer 38-4 may also be located outside the lower ball pad 14LO.

The dummy redistribution structure 34-4 may include the upper dummy via 30UP, the lower dummy via 30LO, and a dummy redistribution layer 32-4. The dummy redistribution layer 32-4 may interconnect the upper dummy via 30UP located on the upper ball pad 14UP and the lower dummy via 30LO located on the lower ball pad 14LO. The dummy redistribution layer 32-4 may extend from the upper dummy via 30UP in the second reverse direction (−Y direction) and be connected to the lower dummy via 30LO. The dummy redistribution structure 34-4 may interconnect the upper ball pad 14UP and the lower ball pad 14LO.

FIGS. 15 to 21 are cross-sectional views for describing a method of manufacturing a lower redistribution structure of a semiconductor package according to an example embodiment.

FIGS. 15 to 21 are provided to describe a method of manufacturing the lower redistribution structure rds1 of the semiconductor package PK1 of FIGS. 1 to 6. In FIGS. 15 to 21, descriptions identical to those given above with reference to FIGS. 1 to 6 will be briefly given or omitted.

Figure 15:
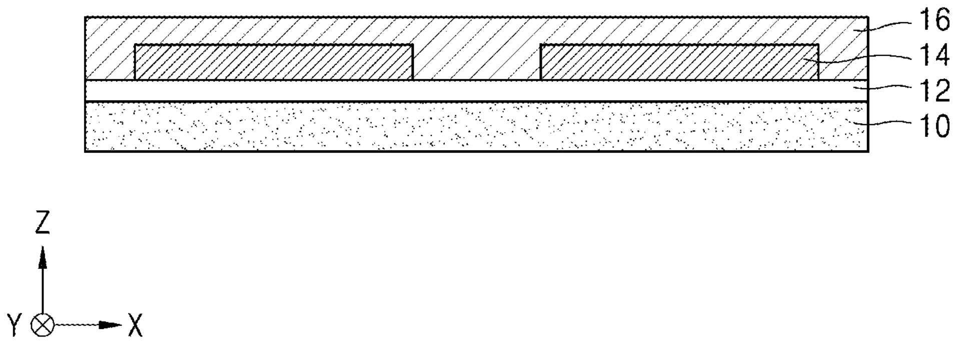
FIGS. 15 to 21 are cross-sectional views for describing a method of manufacturing a lower redistribution structure of a semiconductor package according to an example embodiment.

Referring to FIG. 15, an adhesive layer 12 may be on a carrier substrate 10. Subsequently, the ball pad 14 may be on the adhesive layer 12. A plurality of ball pads 14 may be apart from one another. A first redistribution insulating material layer 16 may be on the ball pad 14.

Figure 16:
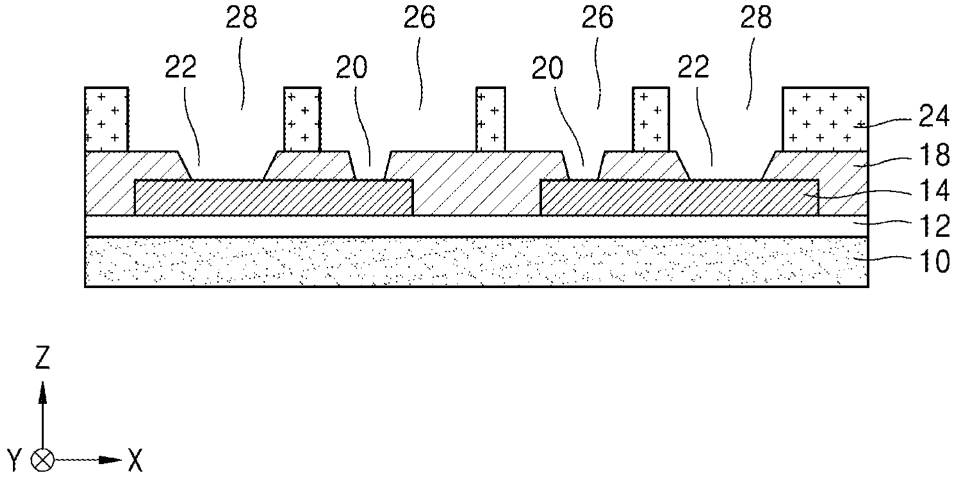

Referring to FIG. 16, the first redistribution insulation layer 18 having a first active via hole 20 and a dummy via hole 22 may be formed by patterning the first redistribution insulating material layer 16 through a photolithography process. The first active via hole 20 and the dummy via hole 22 may be on the ball pad 14 to expose portions of the ball pad 14.

Subsequently, a first photoresist pattern 24 having a first hole 26 and a second hole 28 respectively exposing the first active via hole 20 and the dummy via hole 22 may be on the first redistribution insulation layer 18. The first photoresist pattern 24 may be formed through a photolithography process.

The first hole 26 may be on the first active via hole 20 to further expose a portion of the first redistribution insulation layer 18. The second hole 28 may be on the dummy via hole 22 to further expose a portion of the first redistribution insulation layer 18.

Figure 17:
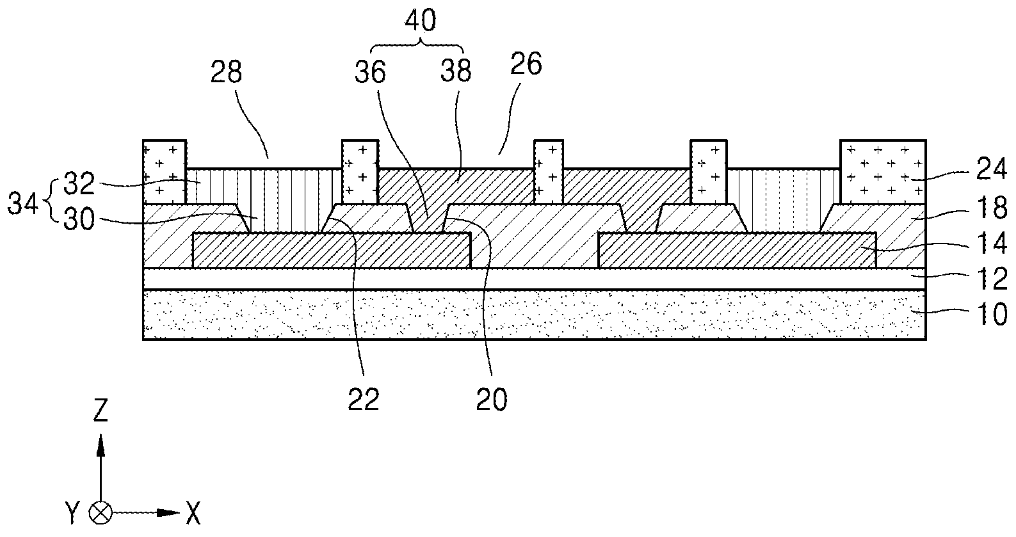

Referring to FIG. 17, the first active redistribution structure 40 may be formed by forming a metal layer in the first active via hole 20 and the first hole 26 defined by the first photoresist pattern 24. The dummy redistribution structure 34 may be in the dummy via hole 22 and the second hole 28. The first active redistribution structure 40 and the dummy redistribution structure 34 may be simultaneously formed through a single process.

The first active redistribution structure 40 may include the first active via 36 and the first active redistribution layer 38. The first active via 36 may be buried in the first active via hole 20. The first active redistribution layer 38 may be buried in the first hole 26 on the first active via 36. The first active via 36 and the first active redistribution layer 38 may be formed through a single process as a single body.

The dummy redistribution structure 34 may include the dummy via 30 and the dummy redistribution layer 32. The dummy via 30 may be buried in the dummy via hole 22. The dummy redistribution layer 32 may be buried in the second hole 28. The dummy via 30 and the dummy redistribution layer 32 may be formed through a single process as a single body.

Figure 18:
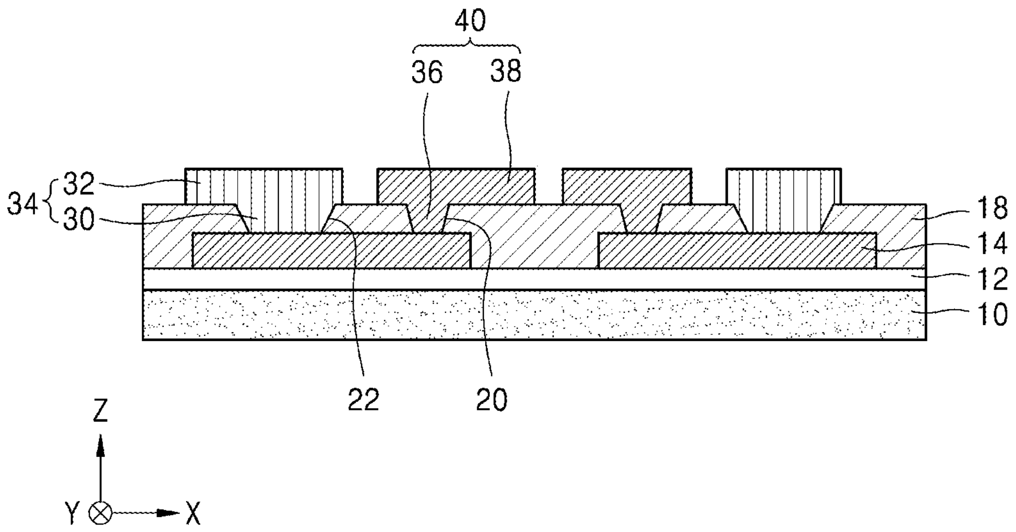
Figure 19:
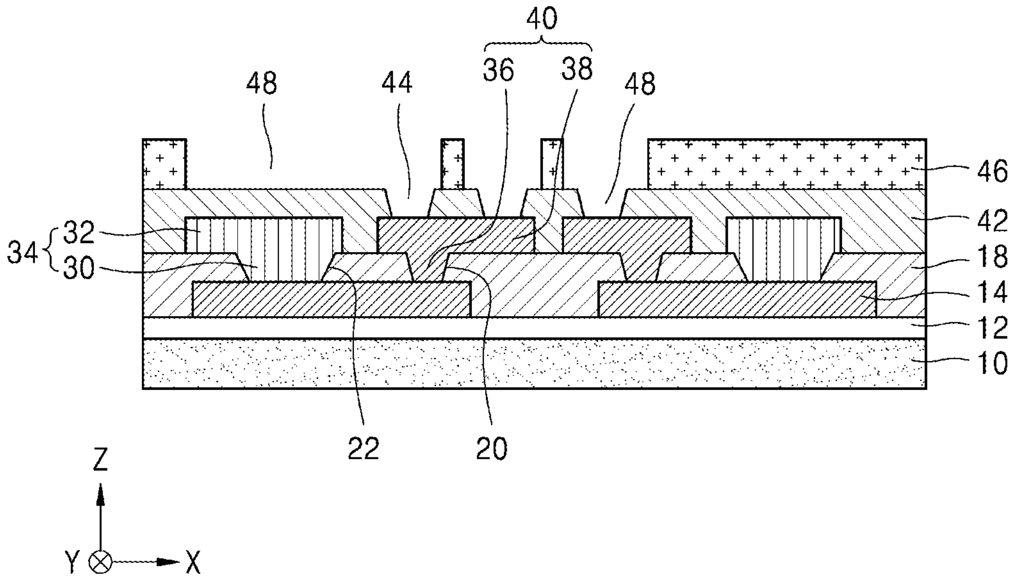

Referring to FIGS. 18 and 19, as shown in FIG. 18, the first photoresist pattern (24 of FIG. 17) may be removed. As shown in FIG. 19, the second redistribution insulation layer 42 having a second active hole 44 may be on the dummy redistribution structure 34 and the first active redistribution structure 40. The second active hole 44 may expose a portion of the first active redistribution layer 38.

After a second redistribution insulating material layer is on the dummy redistribution structure 34 and the first active redistribution structure 40, the second redistribution insulation layer 42 may be formed through a photolithography process.

Subsequently, a second photoresist pattern 46 having a third hole 48 exposing the second active hole 44 may be on the second redistribution insulation layer 42. The second photoresist pattern 46 may be formed through a photolithography process. The third hole 48 may be on the second active hole 44 to further expose a portion of the second redistribution insulation layer 42.

Figure 20:
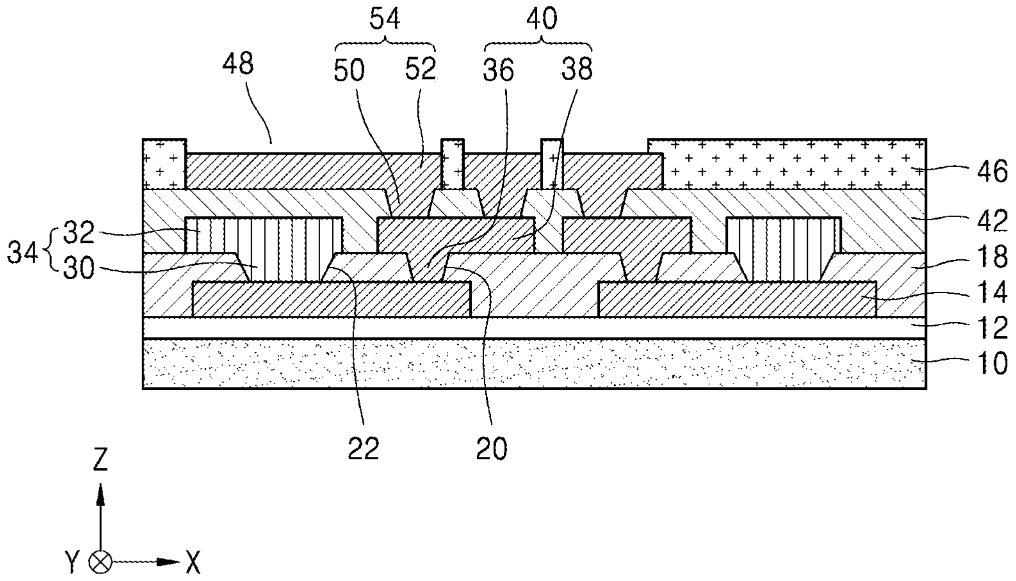

Referring to FIG. 20, a metal layer may be in the second active via hole (44 of FIG. 19) and the third hole (48 of FIG. 19) defined by the second photoresist pattern 46, thereby forming second active redistribution structures 54. The second active redistribution structures 54 may be in the second active via hole (44 of FIG. 19) and the third hole (48 of FIG. 19). The second active redistribution structures 54 may be simultaneously formed through a single process.

The second active redistribution structure 54 may include the second active via 50 and the second active redistribution layer 52. The second active via 50 may be buried in the second active via hole (44 of FIG. 19). The second active redistribution layer 52 may be on the second active via 50 buried in the third hole (48 of FIG. 19). The second active via 50 and the second active redistribution layer 52 may be formed through a single process as a single body.

Figure 21:
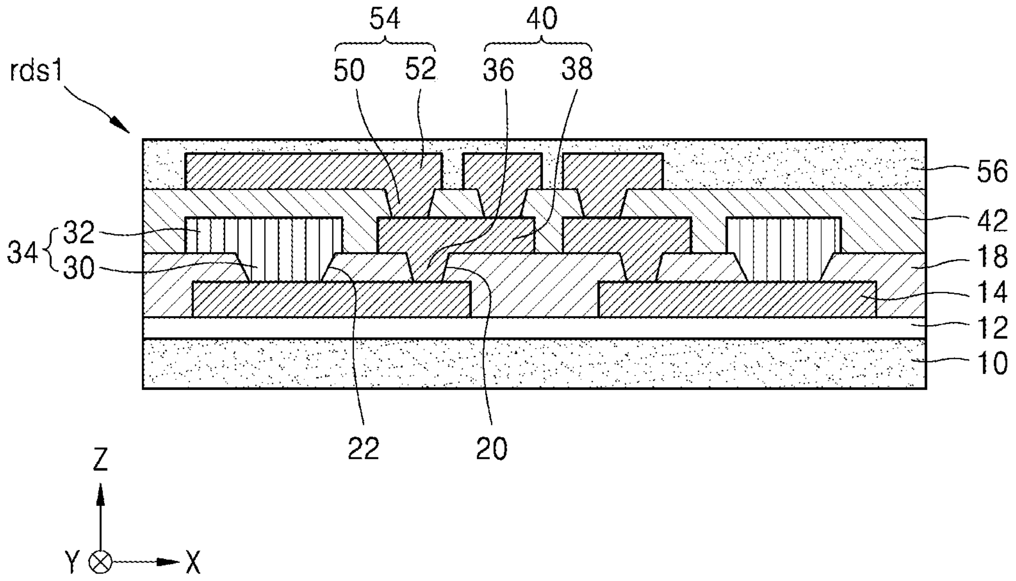

Referring to FIG. 21, the second photoresist pattern (46 of FIG. 20) may be removed. The third redistribution insulation layer 56 may be on the second active redistribution structure 54 and the second redistribution insulation layer 42. Subsequently, the lower redistribution structure rds1 may be completed by removing the carrier substrate 10 and the adhesive layer 12.

Figure 22:
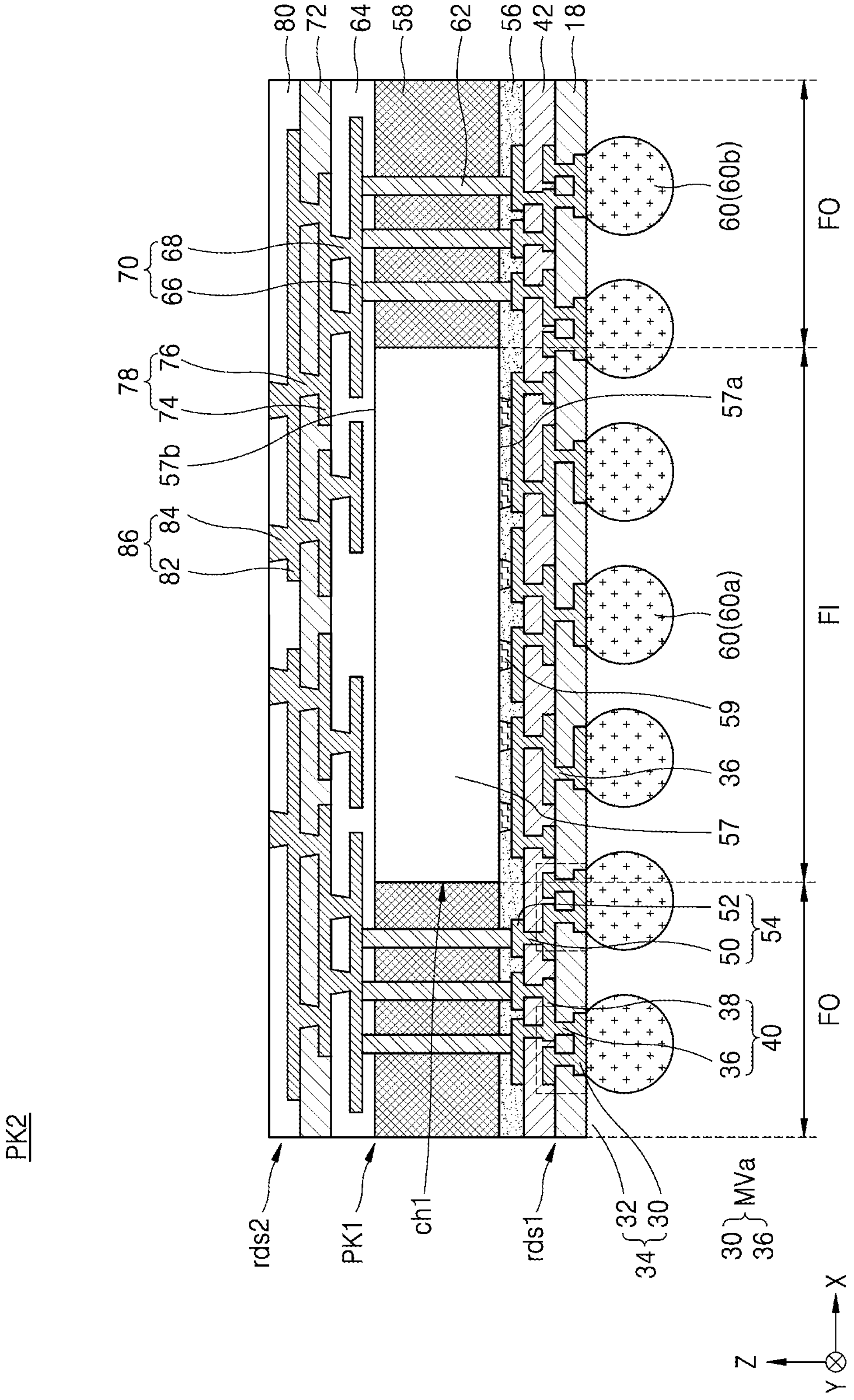
FIG. 22 is a cross-sectional view of a semiconductor package according to an example embodiment.

FIG. 22 is a cross-sectional view of a semiconductor package according to an example embodiment. A semiconductor package PK2 may be identical to the semiconductor package PK1 of FIGS. 1 to 6 except that a redistribution connection via 62 and an upper redistribution structure rds2 may be further formed. In FIG. 22, descriptions identical to those given above with reference to FIGS. 1 to 6 will be briefly given or omitted.

The semiconductor package PK2 may include the semiconductor package PK1 of FIGS. 1 to 6. The semiconductor package PK1 may include the lower redistribution structure rds1, the first semiconductor chip ch1, the molding layer 58, and the solder balls 60. Furthermore, the semiconductor package PK2 may include the redistribution connection via 62 and the upper redistribution structure rds2.

The redistribution connection via 62 may be in the molding layer 58. The redistribution connection via 62 may penetrate through the upper portion and the lower portion of the molding layer 58. The redistribution connection via 62 may include a metal layer, e.g., a copper layer. The upper redistribution structure rds2 may be on the semiconductor package PK1.

The upper redistribution structure rds2 may be on the molding layer 58, the redistribution connection via 62, and the first semiconductor chip ch1. The upper redistribution structure rds2 may be electrically connected to the lower redistribution structure rds1 through the redistribution connection via 62.

The upper redistribution structure rds2 may include a fourth redistribution insulation layer 64, a fifth redistribution insulation layer 72, and a sixth redistribution insulation layer 80. The fifth redistribution insulation layer 72 and the sixth redistribution insulation layer 80 may be sequentially on the fourth redistribution insulation layer 64. The fourth redistribution insulation layer 64, the fifth redistribution insulation layer 72, and the sixth redistribution insulation layer 80 may include the same material as the first redistribution insulation layer 18, the second redistribution insulation layer 42, and the third redistribution insulation layer 56 of the lower redistribution structure rds1.

A third active redistribution structure 70 may be in the fourth redistribution insulation layer 64. The third active redistribution structure 70 may include a third active redistribution layer 66 and a third active via 68.

A fourth active redistribution structure 78 electrically connected to the third active redistribution structure 70 may be in the fifth redistribution insulation layer 72. The fourth active redistribution structure 78 may include a fourth active redistribution layer 74 and a fourth active via 76.

A fifth active redistribution structure 86 electrically connected to the fourth active redistribution structure 78 may be in the sixth redistribution insulation layer 80. The fifth active redistribution structure 86 may include a fifth active redistribution layer 82 and a fifth active via 84.

The third active redistribution structure 70, the fourth active redistribution structure 78, and the fifth active redistribution structure 86 may include a metal layer including a metal e.g. gold, copper, nickel, stainless steel, or beryllium copper.

Figure 23:
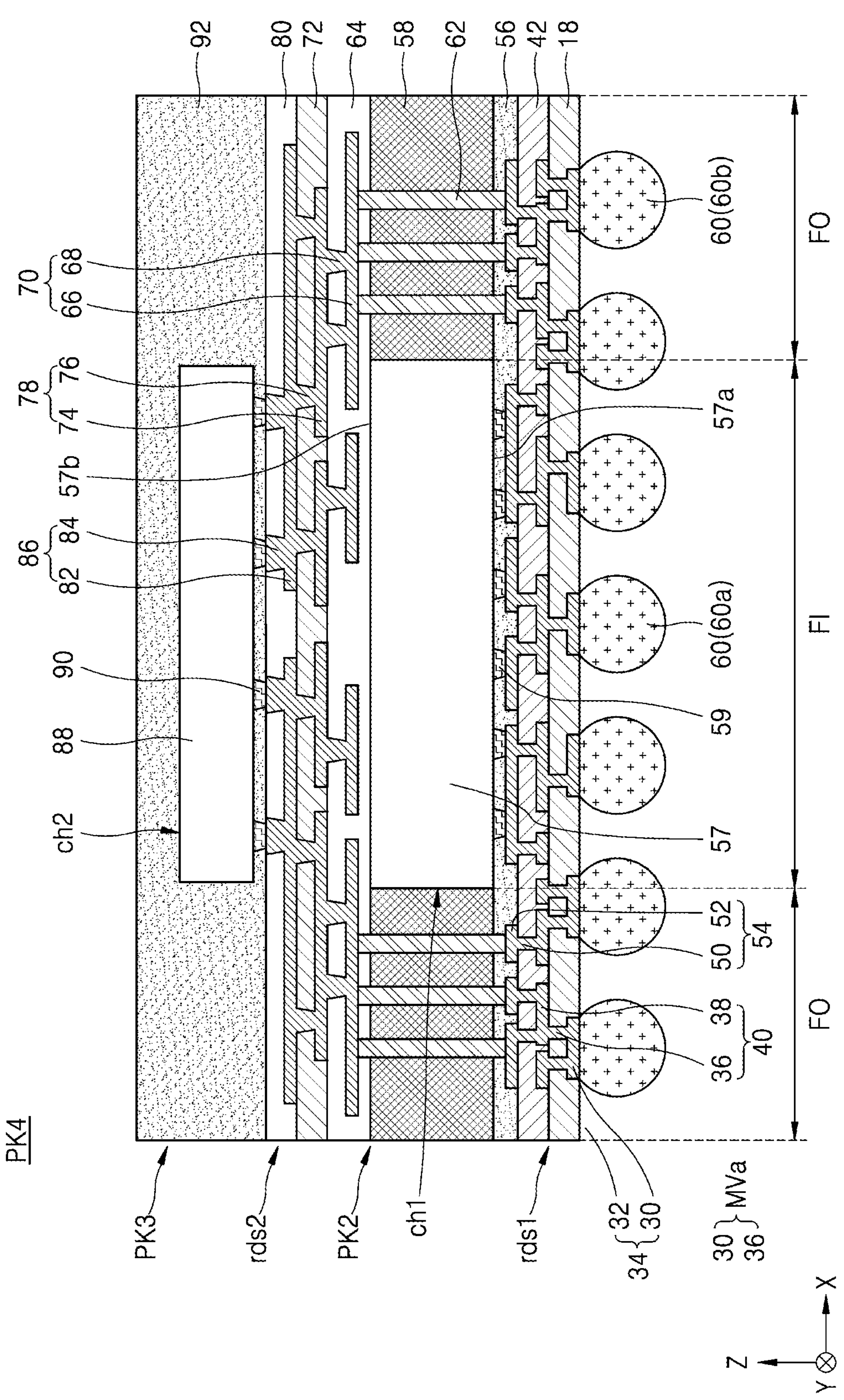
FIG. 23 is a cross-sectional view of a semiconductor package according to an example embodiment.

FIG. 23 is a cross-sectional view of a semiconductor package according to an example embodiment. A semiconductor package PK4 may be identical to the semiconductor package PK2 of FIG. 22, except that an upper semiconductor package PK3 may be further stacked. In FIG. 23, descriptions identical to those given above with reference to FIGS. 1 to 6 and 22 will be briefly given or omitted.

In the semiconductor package PK4, the upper semiconductor package PK3 may be further mounted on the semiconductor package PK2 of FIG. 22. The semiconductor package PK2 may be referred to as a lower semiconductor package. The semiconductor package PK4 may be a package-on-package type package. The semiconductor package PK2 may include the lower redistribution structure rds1, the first semiconductor chip ch1, the molding layer 58, the solder ball 60, the redistribution connection via 62, and the upper redistribution structure rds2. The molding layer 58 may be referred to as a lower molding layer.

In the upper redistribution structure rds2, the fifth active redistribution structure 86 may be in the sixth redistribution insulation layer 80. The fifth active redistribution structure 86 may include the fifth active redistribution layer 82 and the fifth active via 84.

The upper semiconductor package PK3 may include the second semiconductor chip ch2, a second chip connection terminal 90, and an upper molding layer 92. The second semiconductor chip ch2 may be electrically connected to the fifth active via 84 through the second chip connection terminal 90.

The second semiconductor chip ch2 may be directly connected to the fifth active via 84 through the second chip connection terminal 90. However, when the second semiconductor chip ch2 is mounted on a wiring substrate, the second semiconductor chip ch2 may be electrically connected to the fifth active via 84 through the wiring substrate.

The second semiconductor chip ch2 may be, e.g., a memory chip. The memory chip may be, e.g., a volatile memory chip e.g., a dynamic random access memory (DRAM) or a static random access memory (SRAM) or a non-volatile memory chip e.g. a phase-change random access memory (PRAM), a magneto-resistive random access memory (MRAM) a ferroelectric random access memory (FeRAM), or a resistive random access memory (RRAM).

Figure 24:
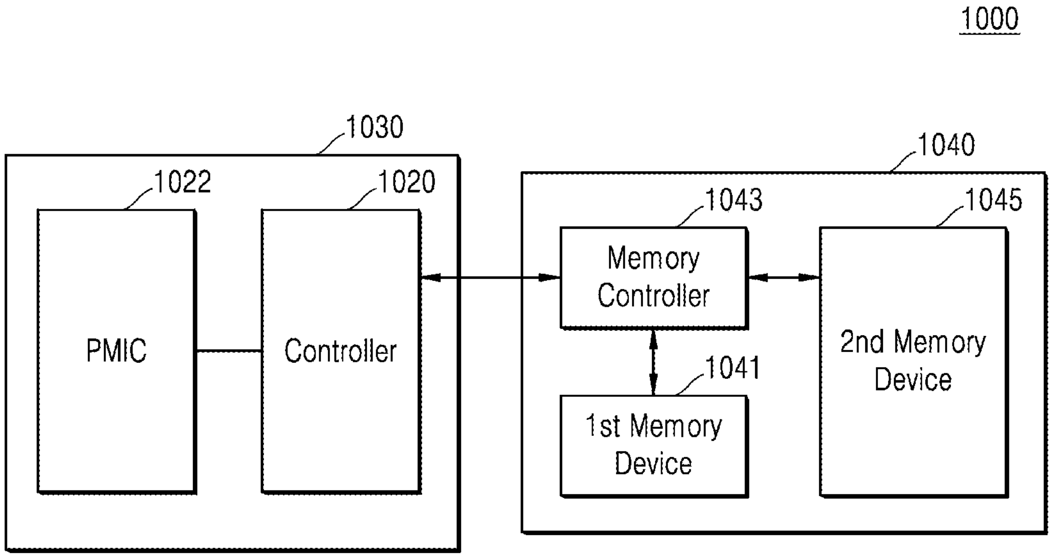
FIG. 24 is a block diagram showing a configuration of a semiconductor package according to an example embodiment.

FIG. 24 is a block diagram showing a configuration of a semiconductor package according to an example embodiment. A semiconductor package 1000 may include the semiconductor package PK4. The semiconductor package 1000 may include a controller chip 1020, a first memory chip 1041, a second memory chip 1045, and a memory controller 1043. The semiconductor package 1000 may further include a PMIC 1022 that may supply currents of operating voltages to the controller chip 1020, the first memory chip 1041, the second memory chip 1045, and the memory controller 1043, respectively. Operating voltage applied to respective components may be designed the same as or different from one another.

A lower semiconductor package 1030 including the controller chip 1020 and the PMIC 1022 may be the lower semiconductor package PK2. A second upper semiconductor package 1040 including the first memory chip 1041, the second memory chip 1045, and the memory controller 1043 may correspond to the upper semiconductor package PK3.

The semiconductor package 1000 may be included in a personal computer (PC) or a mobile device. The mobile devices may be implemented as a laptop computer, a mobile phone, a smartphone, a tablet PC, a personal digital assistant (PDA), an enterprise digital assistants (EDA), a digital still camera, a digital video camera, a portable multimedia player (PMP), a personal navigation device or a portable navigation device (PND), a handheld game console, a mobile internet device (MID), a wearable computer, an internet of things (IoT) device, an internet of everything (IoE) device, or a drone.

The controller chip 1020 may control operations of the first memory chip 1041, the second memory chip 1045, and the memory controller 1043. In an implementation, the controller chip 1020 may be implemented by an integrated circuit (IC), a system-on-chip (SoC), an application processor (AP), a mobile AP, a chipset, or a set of chips. The controller chip 1020 may include a central processing unit (CPU), a graphics processing unit (GPU), or a modem. In some embodiments, the controller chip 1020 may perform the function of a modem and the function of an AP.

The memory controller 1043 may control the second memory chip 1045 according to the control of the controller chip 1020. The first memory chip 1041 may be implemented by a volatile memory device. The volatile memory device may include a random access memory (RAM), a dynamic RAM (DRAM), or a static RAM (SRAM). The second memory chip 1045 may be implemented by a storage memory device. The storage memory device may be implemented by a non-volatile memory device.

The storage memory device may be implemented by a flash-based memory device. The second memory chip 1045 may be implemented by a NAND-type flash memory device. The NAND-type flash memory device may include a 2-dimensional memory cell array or a 3-dimensional memory cell array. The 2-dimensional memory cell array or the 3-dimensional memory cell array may include a plurality of memory cells, and the memory cells may each store 1-bit of data or 2 or more bits of data.

When the second memory chip 1045 is implemented by a flash-based memory device, the memory controller 1043 may use (or support) a multimedia card (MMC) interface, an embedded MMC (eMMC) interface, or a universal flash storage (UFS) interface.

Figure 25:
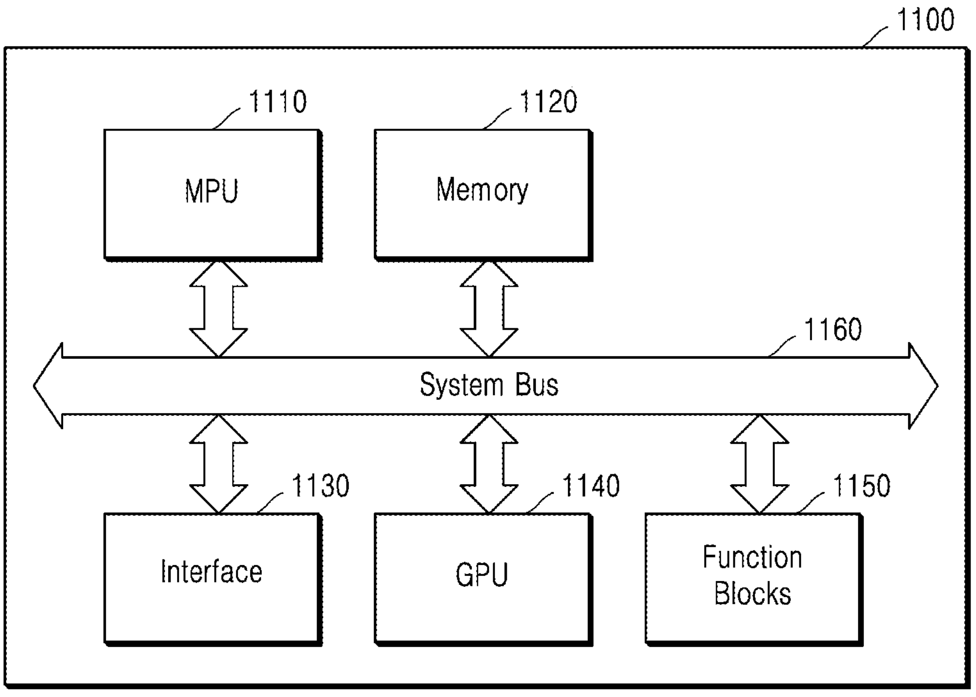
FIG. 25 is a block diagram schematically showing a configuration of a semiconductor package according to an example embodiment.

FIG. 25 is a block diagram schematically showing a configuration of a semiconductor package according to an example embodiment.

A semiconductor package 1100 may include a microprocessor 1110, a memory 1120, an interface 1130, a graphics processing unit 1140, function blocks 1150, and a bus 1160 connecting them to one another. The semiconductor package 1100 may include both the microprocessor 1110 and the graphics processing unit 1140 or may include only one of them.

The microprocessor 1110 may include a core and an L2 cache. In an implementation, the microprocessor 1110 may include multi-cores. Cores of the multi-cores may have performance same as or different from one another. Also, the core of the multi-cores may be activated at the same time or may be activated at different times. The memory 1120 may store a result of processing performed by the function blocks 1150 under the control of the microprocessor 1110. In an implementation, data may be stored in the memory 1120 as the contents stored in the L2 cache of the microprocessor 1110 may be flushed. The interface 1130 may interface with external devices. In an implementation, the interface 1130 may interface with a camera, an LCD, and a speaker.

The graphics processing unit 1140 may perform graphic functions. In an implementation, the graphics processing unit 1140 may execute a video codec or process 3D graphics. The function blocks 1150 may perform various functions. In an implementation, when the semiconductor package 1100 is a fan-out semiconductor package and an AP used in a mobile device, some of the function blocks 1150 may perform a communication function.

The semiconductor package 1100 may be the semiconductor package PK4 exemplified above. The microprocessor 1110 or the graphics processing unit 1140 may be the lower semiconductor package PK2 described above. The memory 1120 may be the upper semiconductor package PK3 exemplified above. The interface 1130 and the function blocks 1150 may correspond to portions of the lower semiconductor package PK2 described above.

By way of summation and review, a semiconductor package capable of improving the reliability of a redistribution structure is disclosed. A semiconductor package in which a semiconductor chip is on a redistribution structure has been proposed, and thus it is necessary to improve the reliability of the redistribution structure. A semiconductor package may be capable of improving the reliability of a redistribution structure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:

a lower redistribution structure, including a redistribution insulation layer, a plurality of ball pads in the redistribution insulation layer apart from one another, a double via having a first active via and a dummy via located on at least one of the plurality of ball pads and apart from each other in the redistribution insulation layer, and a first active redistribution layer electrically connected to the first active via in the redistribution insulation layer;

solder balls electrically connected to the plurality of ball pads under the lower redistribution structure;

a first semiconductor chip on the lower redistribution structure and electrically connected to the first active via and the first active redistribution layer of the lower redistribution structure; and a molding layer molding the first semiconductor chip on the lower redistribution structure, wherein a dummy redistribution layer is in the redistribution insulation layer on the dummy via.

2. The semiconductor package as claimed in claim 1, wherein the dummy via is configured to increase adhesion between the redistribution insulation layer and the plurality of ball pads.

3. The semiconductor package as claimed in claim 1, wherein the dummy via has a larger diameter than the first active via.

4. The semiconductor package as claimed in claim 1, wherein the dummy via and the first active via are spaced apart from each other in any one of a first horizontal direction and a second horizontal direction on the at least one of the plurality of ball pads.

5. The semiconductor package as claimed in claim 1, wherein the dummy redistribution layer has a width greater than a diameter of the dummy via.

6. The semiconductor package as claimed in claim 1, wherein the dummy redistribution layer extends in any one of a first horizontal direction and a second horizontal direction on the at least one of the plurality of ball pads.

7. The semiconductor package as claimed in claim 1, wherein the dummy redistribution layer extends in any one of a first horizontal direction and a second horizontal direction on two of the plurality of ball pads to interconnect two dummy vias.

8. The semiconductor package as claimed in claim 1, wherein a first diameter of each of the plurality of ball pads is greater than a second diameter of each of the solder balls.

9. The semiconductor package as claimed in claim 1, wherein the double via is located in a region near an edge of the first semiconductor chip.

10. The semiconductor package as claimed in claim 1, wherein the double via is located in a peripheral region of the first semiconductor chip.

11. A semiconductor package, comprising:

a lower redistribution structure having a fan-in region and a fan-out region, the lower redistribution structure including a redistribution insulation layer, a plurality of ball pads in the redistribution insulation layer apart from one another, first active vias electrically connected to the plurality of ball pads, and a first active redistribution layer electrically connected to the first active vias;

solder balls electrically connected to the plurality of ball pads under the lower redistribution structure;

a first semiconductor chip on the fan-in region of the lower redistribution structure and electrically connected to the first active vias and the first active redistribution layer of the lower redistribution structure; and a molding layer molding the first semiconductor chip on the fan-out region of the lower redistribution structure, wherein:

the lower redistribution structure further includes a dummy via on at least one ball pad from among the plurality of ball pads in the fan-out region, and a double via including a first active via and the dummy via spaced apart from each other is on the at least one ball pad of the fan-out region, wherein a dummy redistribution layer is in the redistribution insulation layer on the dummy via, and the dummy redistribution layer extends in any one of a first horizontal direction and a second horizontal direction on the at least one ball pad.

12. The semiconductor package as claimed in claim 11, wherein the double via is in a boundary region between the fan-in region and the fan-out region.

13. The semiconductor package as claimed in claim 11, wherein the dummy via and the first active via constituting the double via are spaced apart from each other in any one of a first horizontal direction and a second horizontal direction on the at least one ball pad.

14. The semiconductor package as claimed in claim 11, wherein the first active redistribution layer extends on the at least one ball pad in a horizontal direction different from that of the dummy redistribution layer, and the first active redistribution layer extends in any one of the first horizontal direction and the second horizontal direction.

15. The semiconductor package as claimed in claim 14, wherein the dummy redistribution layer extends in any one of the first horizontal direction and the second horizontal direction on two of the plurality of ball pads to interconnect two dummy vias.

16. A semiconductor package, comprising:

a lower semiconductor package having a lower redistribution structure having a fan-in region and a fan-out region, the lower redistribution structure including a redistribution insulation layer, a plurality of ball pads in the redistribution insulation layer apart from one another, first active vias electrically connected to the plurality of ball pads, and a first active redistribution layer electrically connected to the first active vias, solder balls electrically connected to the plurality of ball pads under the lower redistribution structure, a first semiconductor chip on the fan-in region of the lower redistribution structure and electrically connected to the first active vias and the first active redistribution layer of the lower redistribution structure, a lower molding layer molding the first semiconductor chip on the fan-out region of the lower redistribution structure, a redistribution connection via penetrating through an upper portion and a lower portion of the lower molding layer, an upper redistribution structure being positioned on the lower molding layer, the redistribution connection via, and the first semiconductor chip, and electrically connected to the lower redistribution structure through the redistribution connection via, and a dummy via on at least one of the plurality of ball pads in the fan-out region, the first active vias and the dummy via being spaced apart from each other on the at least one of the plurality of ball pads in the fan-out region, and an upper semiconductor package mounted on the lower semiconductor package including a second semiconductor chip electrically connected to the upper redistribution structure and an upper molding layer molding the second semiconductor chip.

17. The semiconductor package as claimed in claim 16, wherein the first active vias and the dummy via are in a boundary region between the fan-in region and the fan-out region.

18. The semiconductor package as claimed in claim 16, wherein the first semiconductor chip is a logic chip, and the second semiconductor chip is a memory chip.

* * * * *